(12) United States Patent
Asano et al.

(10) Patent No.: US 7,292,955 B2
(45) Date of Patent: Nov. 6, 2007

(54) METHOD AND APPARATUS FOR EXAMINING SEMICONDUCTOR APPARATUS AND METHOD FOR DESIGNING SEMICONDUCTOR APPARATUS

(75) Inventors: Etsuko Asano, Atsugi (JP); Masahiko Hayakawa, Atsugi (JP); Yoshiko Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 710 days.

(21) Appl. No.: 10/411,272

(22) Filed: Apr. 11, 2003

(65) Prior Publication Data

US 2003/0204820 A1    Oct. 30, 2003

(30) Foreign Application Priority Data

Apr. 24, 2002  (JP)  ............................ 2002-123269

(51) Int. Cl.
*G01R 27/28*  (2006.01)
(52) U.S. Cl. ...................... 702/118; 702/117
(58) Field of Classification Search ............... 702/117, 702/118
See application file for complete search history.

(56) References Cited

U.S. PATENT DOCUMENTS 6,326,800 B1 * 12/2001 Kirihata ...................... 324/760

2001/0029600 A1  10/2001  Lee et al.
2001/0032329 A1  10/2001  Lee et al.

FOREIGN PATENT DOCUMENTS

| JP | 5-157799 | 6/1993 |
|---|---|---|
| JP | 6-151735 | 5/1994 |
| JP | 6-313787 | 11/1994 |
| JP | 7-325122 | 12/1995 |
| JP | 10-32257 | 2/1998 |
| JP | 2001-53282 | 2/2001 |
| JP | 2001-284457 | 10/2001 |

OTHER PUBLICATIONS

M. Inuishi et al., "A High Performance and Highly Reliable Dual Gate CMOS with Gate/N' Overlapped LDD Applicable to the Cryogenic Operation," International Electron Devices Meeting, Dec. 3-6, 1989, IEDM Technical Digest, pp. 773-776.

T. Hori, "1/4-μm LATID (LArge Tilt-angle Implanted Drain) Technology For 3.3-V Operation," International Electron Devices, Meeting, Dec. 3-6, 1989, IEDM Technical Digest, pp. 777-780.

* cited by examiner

*Primary Examiner*—Michael Nghiem
*Assistant Examiner*—Stephen J Cherry
(74) *Attorney, Agent, or Firm*—Eric J. Robinson; Robinson Intellectual Property Law Office, P.C.

(57) ABSTRACT

The invention performs an AC stress test assuming the CMOS operation and an AC stress test using a ring oscillator (R.O.) between a DC stress test method using single semiconductor elements and an aging test method. The deterioration of a semiconductor apparatus can be estimated highly precisely by separately performing the AC stress test assuming the CMOS operation on OFF-stress and ON-stress.

13 Claims, 21 Drawing Sheets measuring of waveform

METHOD AND APPARATUS FOR EXAMINING SEMICONDUCTOR APPARATUS AND METHOD FOR DESIGNING SEMICONDUCTOR APPARATUS

BACKGROUND OF THE INVENTION

1. Field of the Invention

The present invention relates to a reliable semiconductor design system and method for designing devices and circuits required and sufficient for a life of an electrical characteristic of a transistor used in a semiconductor apparatus having semiconductor elements. Furthermore, the present invention relates to a semiconductor apparatus designed by using the design system and method. In particular, the invention relates to a method for examining and estimating the life of a thin film transistor against hot carriers.

2. Description of the Related Art

One of typical physical phenomena relating to the life of a semiconductor element and a semiconductor apparatus is a characteristic deterioration phenomenon due to hot carriers. As a device size decreases, the electric field of the hot carriers increases locally. Therefore, the hot carriers become more important in the operation. As a result, the hot carriers cause the operational failures, reduction in operational functions and reduction in drain current to the drain voltage of the semiconductor apparatus, and the device characteristics and performance are deteriorated.

Here, the deterioration phenomena due to hot electrons will be described. When semiconductor elements, that is, a semiconductor apparatus is operated, a high electric field region is established near the drain region. Electrons flowed into the high electric field region become hot electrons having much higher energy. A part of the hot electrons may be implanted to a gate oxide film and may cause an interfacial level on the Si-SiO$_2$. Thus, the element characteristics may be changed. Hot carriers are caused by positive holes and electrons, which are not in equilibrium and are higher than the grid temperature. Furthermore, substrate hot electrons exist in addition to the hot electrons of the channel electrons.

Carriers generated by collision ionization or avalanche multiplication may be implanted to an oxide film as hot carriers (drain avalanche hot carriers (DAHC)). Alternatively, hot electrons generated by secondary collision ionization may be implanted (secondarily generated hot electron (SGHE)). The details are described in "SUBMICRON DEVICES 2", p. 121 to 142, Mitsumasa Koyanagi, Maruzen Kabushiki Kaisha Shuppan.

The reliability and characteristics of a semiconductor element and a semiconductor apparatus typically with respect to the deterioration due to the hot carriers may be examined and be evaluated by using a Test Element Group (TEG). TEG includes a circuit including multiple semiconductor elements on a test area mounted on a semiconductor chip.

A transient test is known as the examining method. The transient test is one of DC stress test methods. In the transient test, a DC voltage is applied with reference to a VG where the deterioration becomes the maximum. The DC stress test method is an examination method whereby a semiconductor element always receives a certain voltage. According to the DC stress test method, a single semiconductor element can be examined and the result can be obtained in a short period of time by applying a constant voltage to the single semiconductor element.

However, in a real semiconductor apparatus, the bias condition between terminals may change in accordance with the time. Thus, the type of-hot carriers may change. Therefore, the deterioration state may differ. Here, the change in type of hot carriers cause "easing of deterioration" and "promoting of deterioration", for example. Both of them affect each other at the same time, and the real semiconductor apparatus exposes the significantly complicated deterioration.

In order to solve the problem, an AC stress test method is proposed in consideration of stress conditions (such as a bias condition and a duty ratio) applied to a real semiconductor apparatus. In the AC stress test Method, a ring oscillator (R.O.) or inverter chain having multiple TFT's are used for the evaluation as a TEG. A ring oscillator is a circuit in which an odd number of inverter circuits each having a CMOS structure are connected in a ring-shape. The ring oscillator is used for calculating a delay time for one inverter circuit. A method for examining a ring oscillator (R.O. ) is disclosed by Japanese Laid-Open Patent Applications No. 5-157799 and No. 7-325122. An inverter chain is multiple inverter circuit in CMOS structure and is disclosed in Japanese Laid-Open Patent Application No. 6-313787.

Alternative examining method is an aging test method. In the aging test method, a voltage, which is a predetermined stress, is applied to a real semiconductor apparatus (such as a module panel) under a predetermined environment (including a temperature and humidity). The real semiconductor apparatus is operated under the condition for a long period of time, and the minimum driving voltage and changes in current consumption due to the deterioration of the semiconductor apparatus are examined. Especially, the aging test for evaluating a panel may be called panel aging test.

The aging method can examine a semiconductor apparatus to evaluate the deterioration and characteristics. However, obtaining the evaluations may require several thousands of hours or several months as a test period.

On the other hand, a DC stress test method can be used for examining a semiconductor element in a short period of time to evaluate the deterioration and characteristics. However, the estimation and evaluation of the deterioration and characteristic obtained from the DC stress test method are different from those of a real semiconductor apparatus. The cause of the difference in estimation and evaluation is considered as that a constant voltage is applied as a stress in the DC stress test method while a real stress applied to a semiconductor apparatus is an alternate-current voltage (pulse voltage).

Even when an alternate current voltage (pulse voltage) is applied to a semiconductor apparatus as a stress in the AC stress test, a difference may occur in results of the examinations on semiconductor apparatuses. This is because the stress occurring in a real semiconductor apparatus cannot be evaluated and be considered accurately enough. Therefore, estimating the accurate deterioration and characteristics of a semiconductor apparatus has been difficult.

In this way, the estimation of the deterioration and characteristics based on a result of a DC stress test method or an AC stress test method does not always and simply correspond to the estimation of those of a semiconductor apparatus. Furthermore, the correlation between these tests is not clear.

SUMMARY OF THE INVENTION

Accordingly, it is an object of the invention to calculate the correlation between the aging test and DC stress test and to highly precisely estimate the deterioration and characteristics of a semiconductor apparatus in a short period of time by using TEG. It is another object of the invention to provide a method for designing a semiconductor apparatus by incorporating the obtained result to a process and design of a semiconductor apparatus.

In order to overcome the problems, according to one aspect of the invention, there is provided a method for estimating and evaluating the deterioration and characteristic change of a semiconductor apparatus highly precisely in a short period of time by calculating the correlation between the aging test method and the DC stress test method for examining a semiconductor apparatus. According to another aspect of the invention, there is provided a method for incorporating requirements obtained by a stress test to the process and design of a real semiconductor apparatus.

More specifically, the invention include a step for performing "an AC stress test assuming the CMOS operation" between the DC stress test method and the aging test method, as shown in FIG. 1A, and a step for performing "an AC stress test using a ring oscillator (R.O.) and a TEG for different kinds of circuit.

In particular, as shown in FIG. 1B, for example, the correlation is calculated between the ON-current deterioration by a DC stress test and the ON-current deterioration by an AC stress test. In order to correlate the amount of change in power source voltage by an aging test on a semiconductor apparatus and the ON-current deterioration by the AC stress test, the ON-current deterioration in amount of change ($\Delta V_{dd}$) in power source voltage is obtained by using a ring oscillator (R.O.) and a TEG for different kinds of circuit.

The AC stress test assuming the CMOS operation is a test in which pulse signals (that is, stress) of 0V and a positive voltage having a predetermined frequency are externally applied to the gate electrode and the drain region of a TEG including a single TFT by turns as shown in FIG. 2. A test using an inverter chain and applying externally 0V and a positive voltage having a predetermined frequency by turns is also a AC stress test assuming the CMOS operation. Because of externally control the stress to be applied, many conditions can be set such as the frequency, duty rate (the ratio of time applying positive voltage to the gate electrode), and voltage value.

The conditions having the duty rates (that is, stress conditions) of zero (0) % and 100% are called OFF-stress state and ON-stress state, respectively. More specifically, the OFF-stress test is one of DC stress tests applying a positive voltage to the gate electrode and 0V to the drain region, and the ON-stress test is one of DC stress tests applying 0V to the gate electrode and a positive voltage to the drain region. According to the invention, the deterioration of a semiconductor apparatus can be estimated and evaluated separately for ON-stress, OFF-stress and transient stress (one of DC stresses; causing the maximum deterioration due to the drain avalanche hot carriers; typical evaluation method is applying Vth+1V to the gate electrode and a positive voltage to the drain region), which have been conventionally difficult to evaluate separately. The invention can separately evaluate deterioration in the rise and fall of applied voltage, that is stress. Furthermore, the invention can estimate the deterioration of a semiconductor apparatus due to a difference in applied voltage, that is stress. In this way, the invention can provide an effective measure for analyzing the mechanism of the deterioration due to AC stress. Therefore, the deterioration of a semiconductor apparatus can be estimated highly precisely.

Then, the correlation can be obtained between the deterioration in ON-current of a semiconductor element due to DC stress and the deterioration in ON-current of a semiconductor element due to AC stress. In this case, the deterioration due to DC stress is obtained by a DC stress test method. The deterioration due to AC stress is obtained by an AC stress test assuming the CMOS operation. In other words, how fast the DC stress to AC stress is deteriorated increasingly (what number of times of acceleration coefficient it is deteriorated) can be estimated. Thus, the difference in acceleration coefficient between DC stress and AC stress, that is, the difference in deterioration speed can be obtained.

The AC stress test using a ring oscillator (R.O.) and a TEG for different kinds of circuit is an examination method by applying a certain amount of voltage (also called power voltage; $V_{dd}$) to a ring oscillator shown in FIG. 3, for example, and by detecting the change in oscillating frequency output from a semiconductor element of the ring oscillator. Alternatively, the same evaluation can be performed by using a shift register and a TEG for other circuits as well as a ring oscillator (R.O.). In this case, the amount of change in power source voltage required for obtaining the initial dynamic characteristic ($\Delta V_{dd}$ hereinafter) can be evaluated by using dynamic characteristics (such as pulse width and delay time), which become more important for the circuit operations.

$\Delta V_{dd}$ is obtained by an AC stress test using a ring oscillator (R.O.) by calculating the relationship between the power source voltage $V_{dd}$ and the oscillating frequency output from the ring oscillator. The $\Delta V_{dd}$ is the amount of change in power source voltage required for obtaining the initial oscillating frequency, that is, the initial dynamic characteristic in the ring oscillator having undergone the stress test.

Next, in order to obtain the correlation between $\Delta V_{dd}$ and the deterioration in ON-current, the ratio of ON-current of a semiconductor element to the $\Delta V_{dd}$ before and after the stress application (ON-current after stress application/initial ON-current) can be obtained. When $\Delta V_{dd}$ is plotted, the ON current ratios before and after the stress application to $\Delta V_{dd}$ have a certain relationship therein.

Then, the result obtained by the AC stress test assuming the CMOS operation is compared with the result obtained from the correlation between $\Delta V_{dd}$ and the deterioration in ON-current. Thus, the correlation between AC stress and $\Delta V_{dd}$ can be obtained where the deterioration rate of ON current is set at a certain value (for example, the deterioration rate of ON-current is 10%. However, the deterioration rate of the ON-current can be set freely).

From the stress test result up to this point, the correlation can be obtained among the DC stress test, the AC stress test assuming the CMOS operation and the AC stress test using a ring oscillator.

Next, the correlation between an AC stress test using a ring oscillator and an aging test will be described. In the aging test method, a driving voltage, which can operate a semiconductor apparatus normally, is applied to the semiconductor apparatus, and the driving voltage is measured before and after the deterioration. The driving voltage changes along with the deterioration and the change corresponds to the amount of change in power source voltage of a ring oscillator required for obtaining the initial dynamic characteristic. Therefore, how much the deterioration characteristic (dynamic characteristic) of the semiconductor apparatus can be estimated by obtaining the correlation between the $\Delta V_{dd}$ obtained from the AC stress test using the ring oscillator and the deterioration in ON-current.

According to the invention, the result obtained by the stress tests may be reflected on the process and design of a semiconductor apparatus. In other words, the stress tests are performed based on the specifications of a semiconductor apparatus, and the proper conditions having small deterioration against the stress close to the real operations can be reflected on the process and design of the semiconductor apparatus.

According to the invention, the correlation between a DC stress test and an aging test can be obtained, and, based on the obtained correlation, the evaluation by an aging test can be obtained from a fast DC stress test. In other words, by calculating the correlation of the obtained results, the criteria reliable close to the real operations of a real semiconductor apparatus can be used in test method using TEG. Therefore, the deterioration and characteristics of the semiconductor apparatus can be estimated fast.

According to the AC stress test method of the invention, the deterioration due to OFF-stress and ON-stress and the deterioration inherent to AC stress such as the rise and fall of applied voltage, which is stress, can be evaluated separately. Therefore, the deterioration and the characteristics of semiconductor apparatus under various states and conditions can be estimated highly precisely.

Furthermore, according to the invention, the obtained estimation and evaluation can be reflected on (feedback) the design and process of a semiconductor apparatus. For example, the process can be adopted which has small deterioration against the stress close to real operations, which is obtained by the examination method according to the invention. The change in dynamic characteristic in long-term operations of a semiconductor apparatus can be estimated, and the change can be reflected on the design relating to the operational margin. Therefore, a semiconductor apparatus guaranteed for the reliability can be provided. Furthermore, the invention can be adopted as design guidelines for requested conditions (such as the specification of driving voltage).

DESCRIPTION OF THE PREFERRED EMBODIMENTS

Embodiments of the invention will be described below with reference to drawings. The polarity of a thin film transistor (called TFT hereinafter), which will be described below, may be either N-type or P-type. The deterioration of ON-current of the TFT may be evaluated both in a linear region and in a saturated region.

First Embodiment

First of all, in this embodiment, DC (transient) stress test and AC stress test assuming CMOS operations are performed on a TFT in a TEG. The test conditions are as follows.

Test temperature: 40° C.

Duty Rate (the ratio of time applying positive voltage to the gate electrode): 50%

DC stress condition: 16 V to the drain region, Vth+1 V to the gate electrode

AC stress condition: 0V and 16V are applied to the gate electrode and the drain region by turns Sample: Single N-channel type TFT with a channel size of L/W=10/8 µm As a life, the deterioration rates (differences in ON-current before and after deterioration/ON-current before deterioration) of ON-current for stress with frequencies are plotted in time. As shown in lines (a) to (c) in FIG. 4, each of the deterioration rates has a linear relationship in log scale. A line (d) in FIG. 4 is a result obtained from the DC (transient) stress test.

Figure 4:
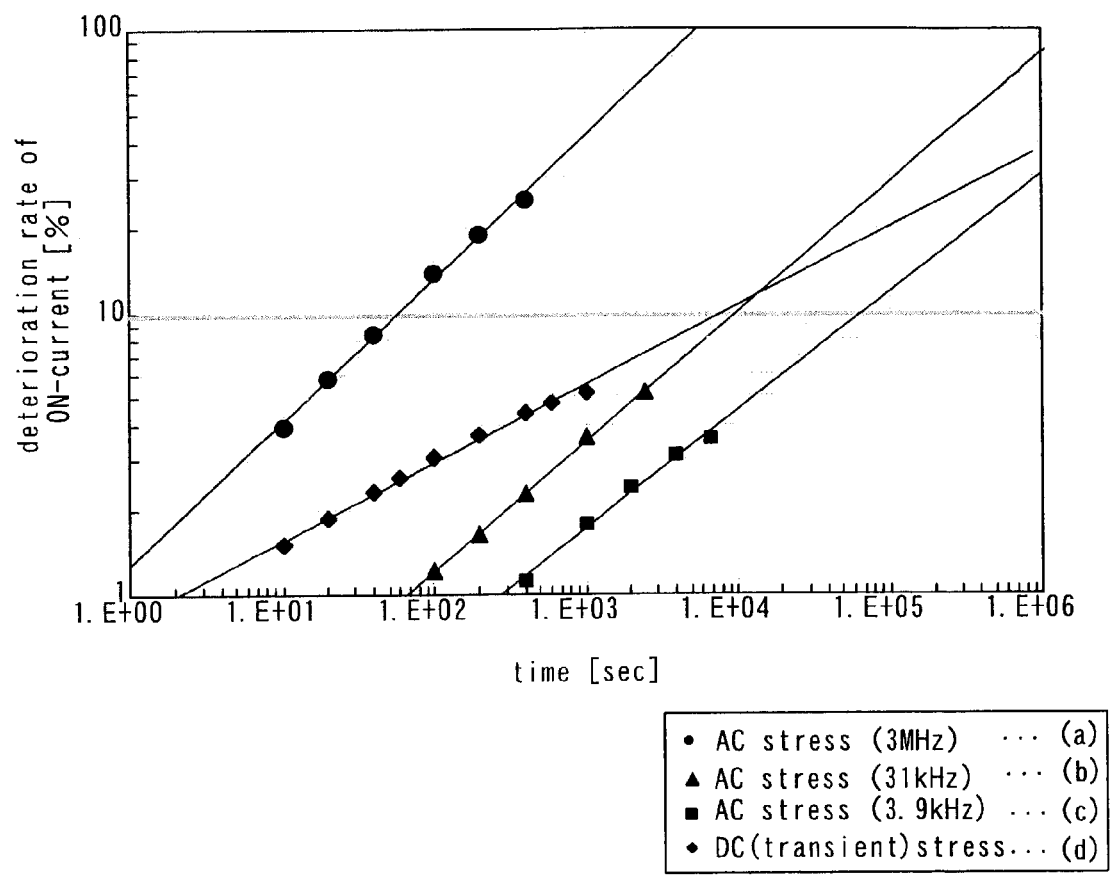
FIG. 4 is a diagram showing results of examinations according to the invention.
Figure 5:
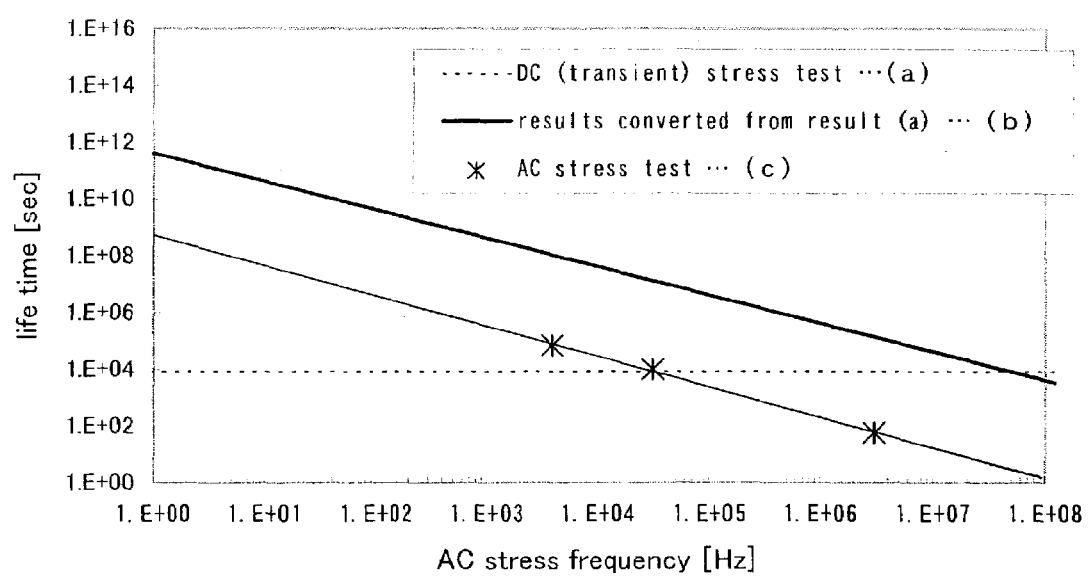
FIG. 5 is a diagram showing results of examinations according to the invention.

FIG. 5 shows a graph plotting times having the deterioration rate of 10% in frequencies of AC stress as a life based on the result obtained from FIG. 4. In this case, numeral values of the deterioration rates may be set freely as an index of life. In FIG. 5, (a) indicates results based on the DC (transient) stress test, (b) indicates results converted from results (a) when the deterioration due to transient stress is dominant in the deterioration due to AC stress, and (c) indicates results based on the AC stress test. The meaning of converted from results based on the transient stress test is that ⅓ of a time for Rise and Fall time is assumed to be equal to a transient stress time.

How much the DC (transient) stress is accelerated and is deteriorated in comparison with AC stress is estimated as an acceleration coefficient. The acceleration coefficient may be a ratio of (a) and (c), which are results of the DC (transient) stress test or may be a ratio of (b) and (c) converted from DC (transient) stress test. Based on the obtained acceleration coefficients, the difference in deterioration speed between the DC (transient) stress and the AC stress can be recognized. For example, when the results of AC Stress Test at frequencies of 31 kHz and 3.9 kHz are compared with the results of the DC (transient) stress test, the acceleration rate of deterioration due to AC stress occurs 1.19 times and 8.13 times, respectively, of that of deterioration due to DC (transient) stress.

In this embodiment, the deterioration with respect to frequencies of applied voltages is examined. Alternatively, deterioration may be examined with respect to voltage values of applied voltages, duty rates of applied voltages, phase shifts of waveforms of applied voltages and angles (steep) of applied voltages.

Figure 1A:
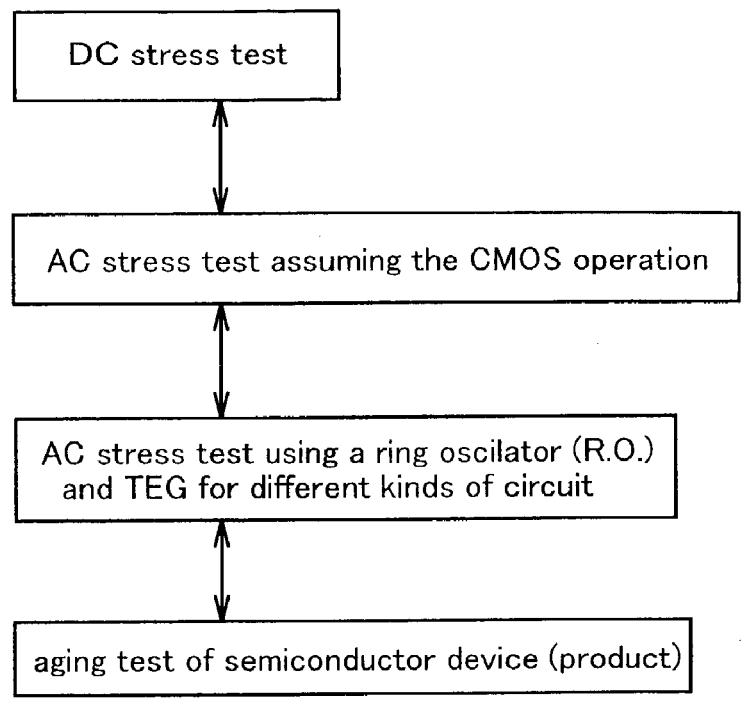
FIGS. 1A and 1B are block diagrams showing the invention.
Figure 1B:
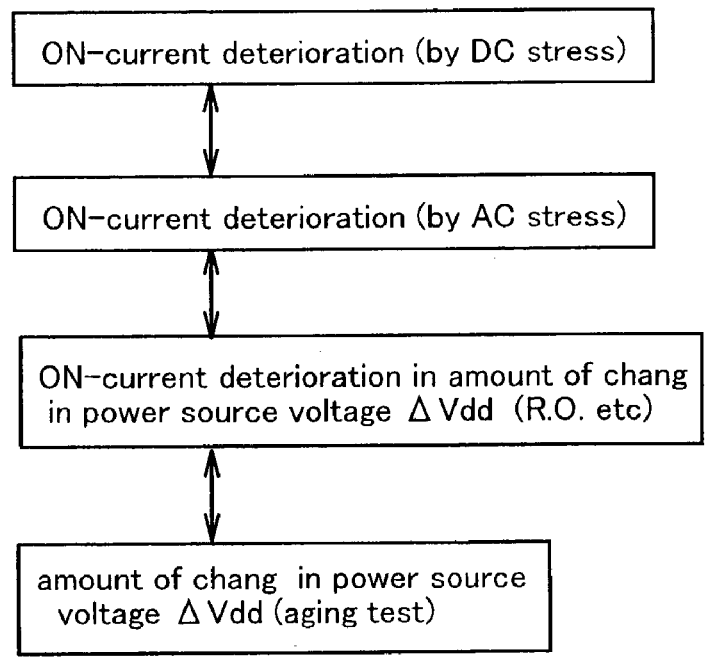
Figure 2:
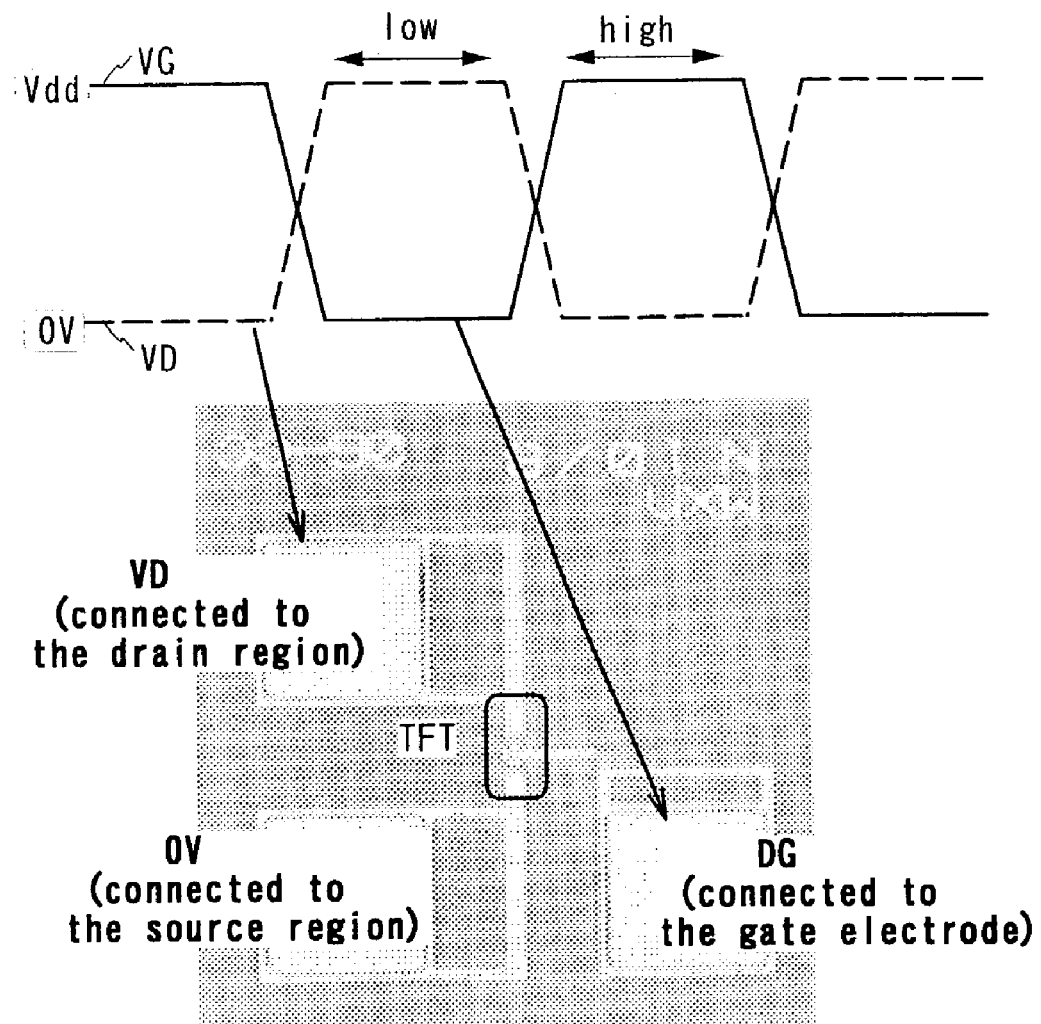
FIG. 2 is a diagram showing an example of a semiconductor element according to the invention.
Figure 3:
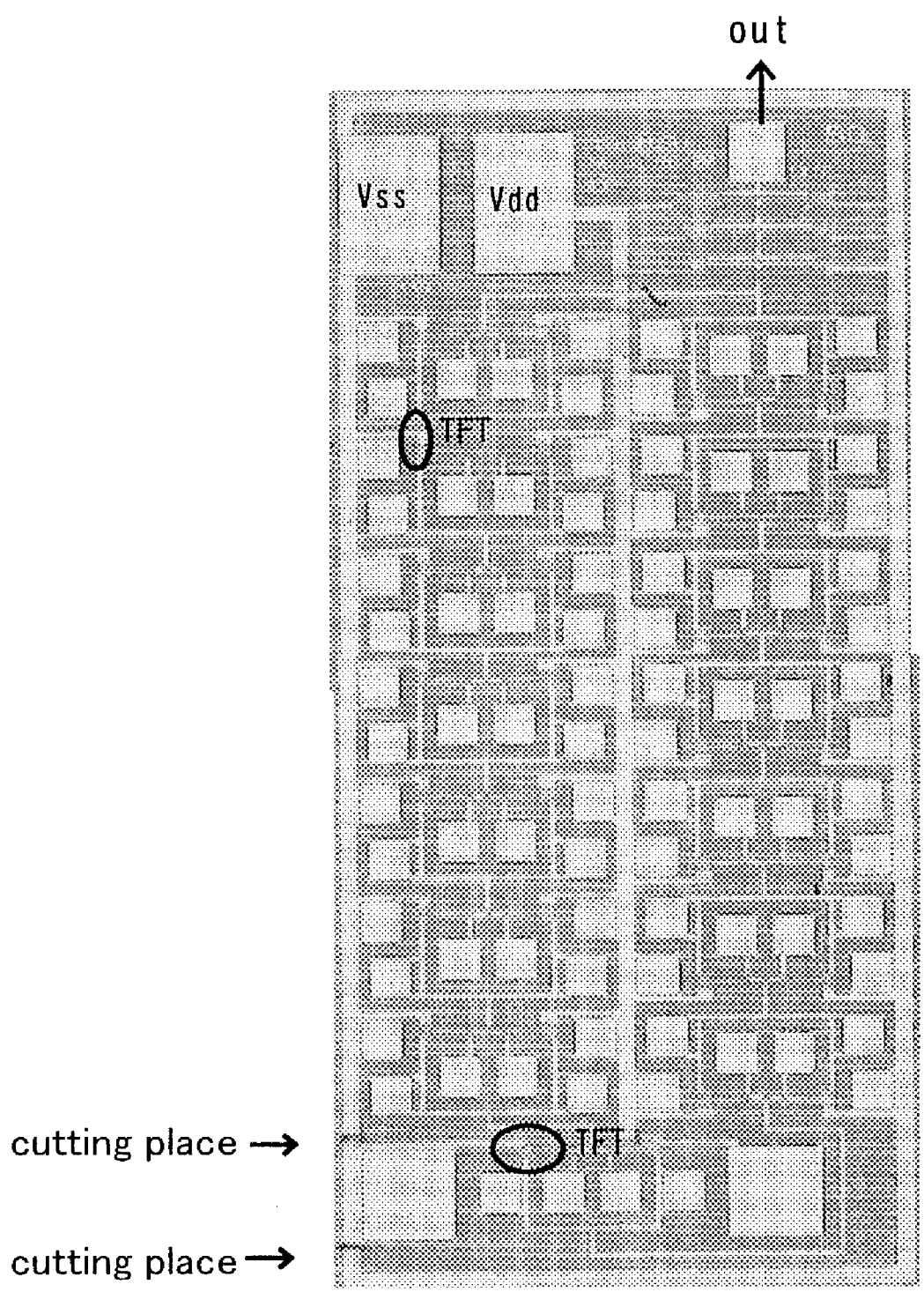
FIG. 3 is a diagram showing an example of a semiconductor circuit according to the invention.

Next, an AC stress test is performed by using a ring oscillator (R.O.) shown in FIG. 3. The test conditions are as follows.

Test temperature: 40° C.
Stress Applying Time: 20 to 100 hours
Stress Voltage: 12 V, 14 V and 16 V
Sample: 19 sections ring oscillator (with a channel size of n-channel type TFT is L/W=6/10 μm and p-channel type TFT is L/W=6/20 μm)

Figure 6:
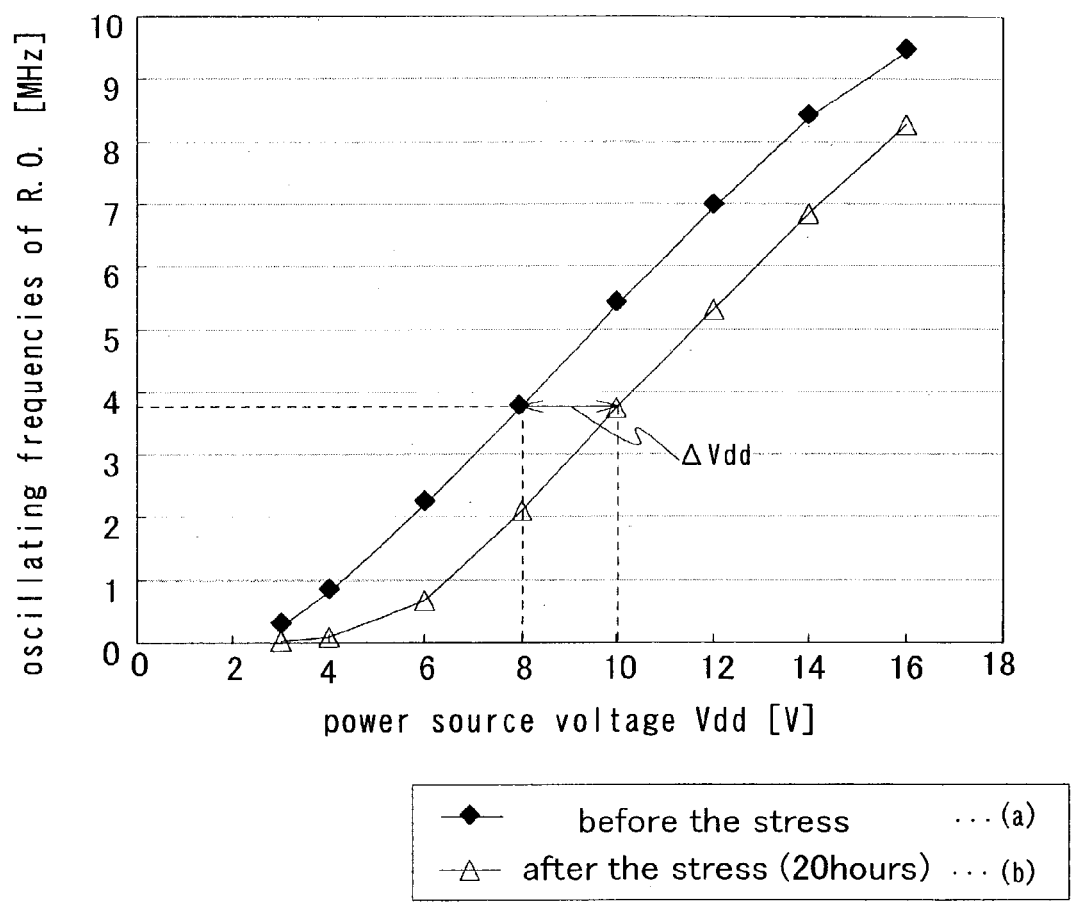
FIG. 6 is a diagram showing results of examinations according to the invention.

FIG. 6 shows a graph plotting voltages (power source voltages) $V_{dd}$ input to the ring oscillator and oscillating frequencies output from the ring oscillator. In FIG. 6, (a) indicates the initial state (where voltage to be stress in applied for zero hour). (b) indicates a state after stress is applied for 20 hours. Based on the graph, the $\Delta V_{dd}$ can be obtained which is equal to an increase in power source voltage required for obtaining a dynamic characteristic at the initial state.

Figure 7A:
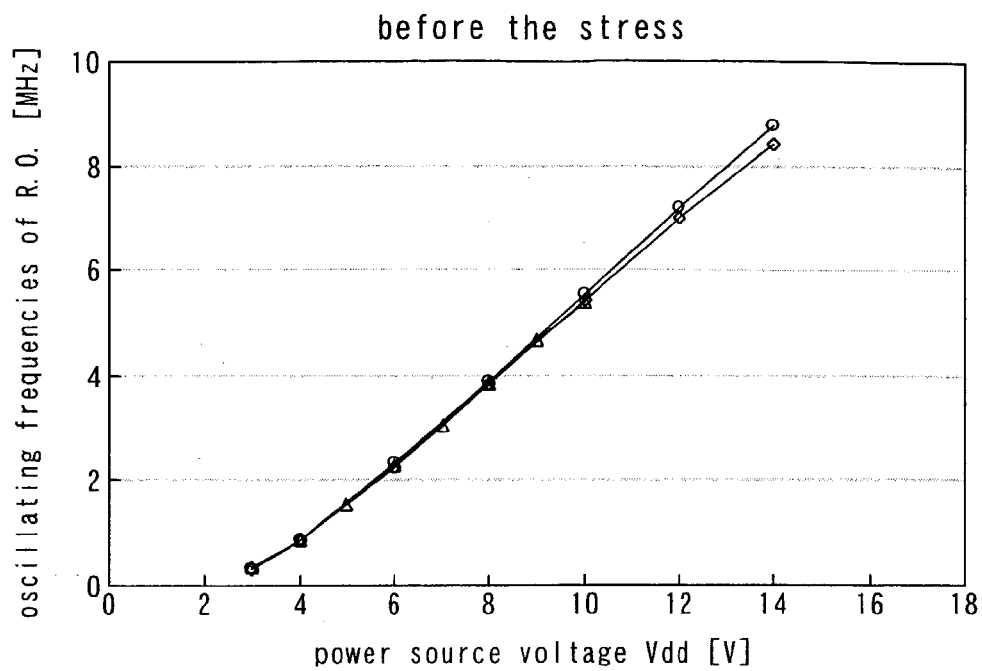
FIGS. 7A and 7B are diagrams showing results of examinations according to the invention.
Figure 7B:
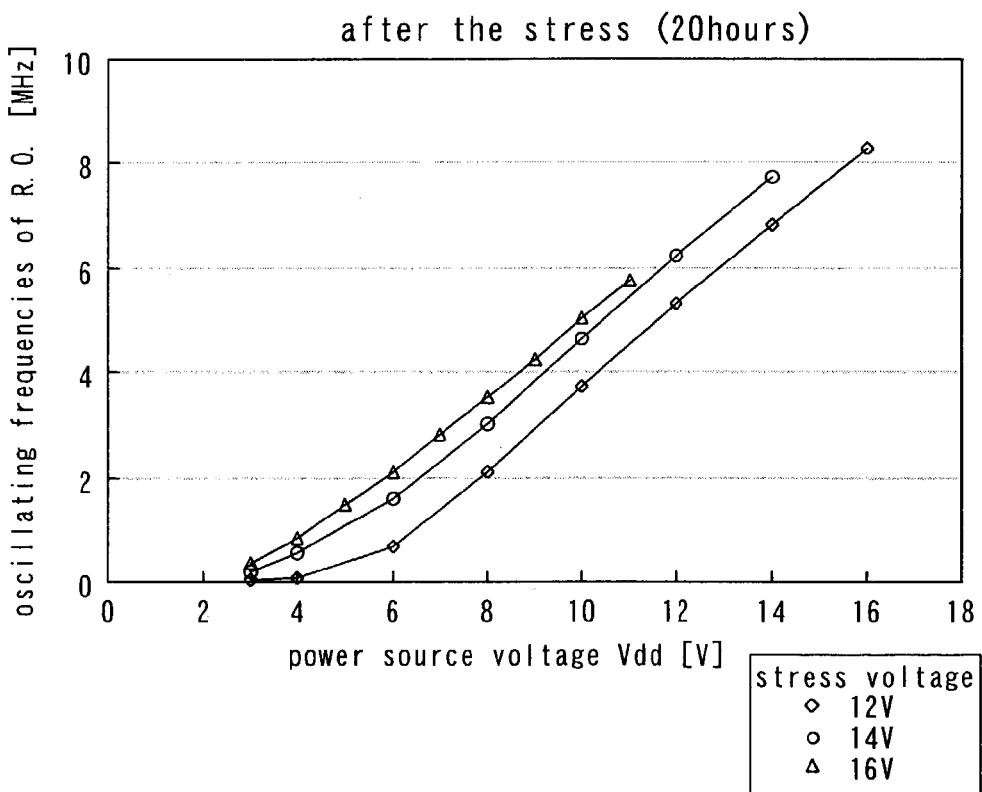

As shown in FIGS. 7A and 7B, oscillating frequencies of the ring oscillator before and after (after 20 hours) of the stress depend on power source voltages ($V_{dd}$). Therefore, the value of the voltage to be applied must be set in consideration of a real semiconductor apparatus, assumed circuits and the like. In this embodiment, when a 10 V CMOS circuit is assumed, the initial power source voltage $V_{dd}$ for evaluating $\Delta V_{dd}$ is 8 V by providing 2V as the voltage-descent margin due to a round pulse etc. In this embodiment, the time for applying the power source voltage to the ring oscillator is 20 hours. However, the time for the application may be set freely.

Figure 8:
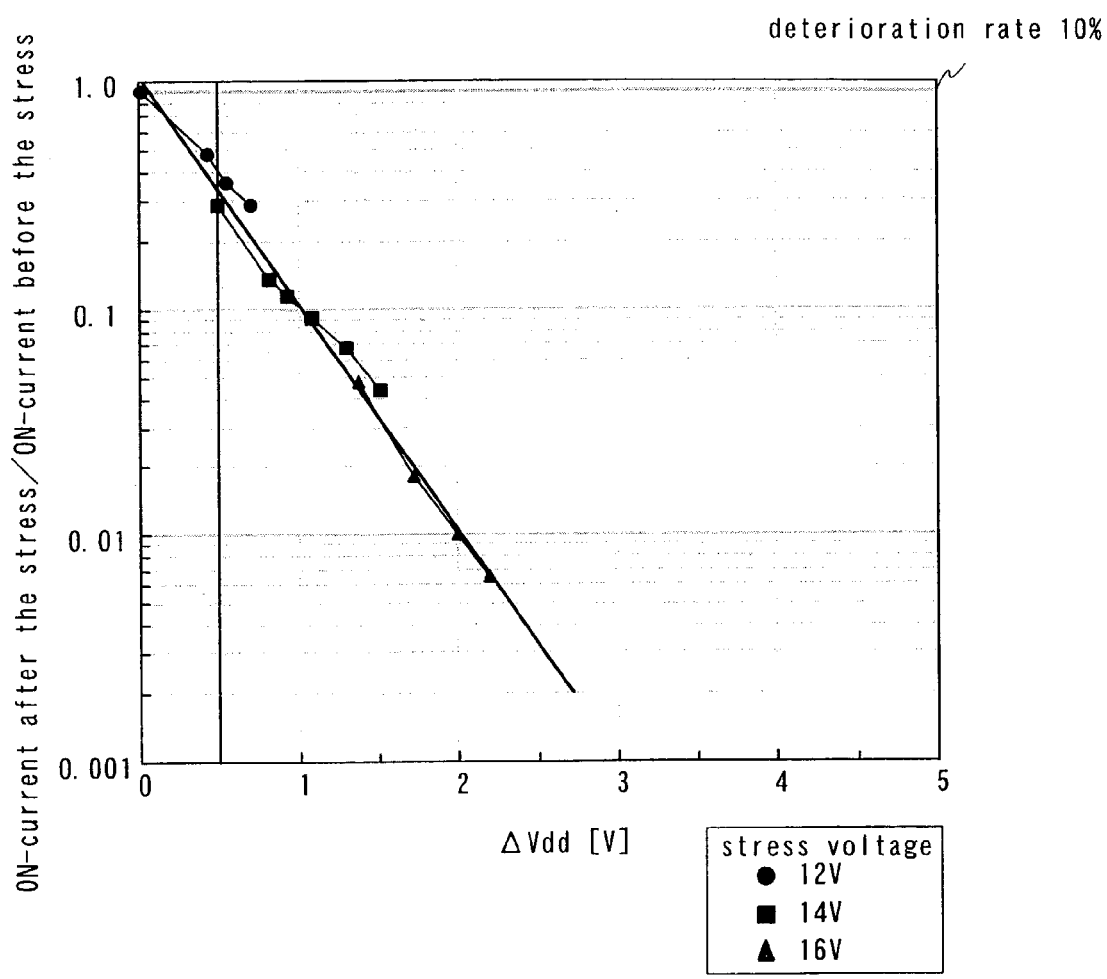
FIG. 8 is a diagram showing results of examinations according to the invention.

Next, the correlation between $\Delta V_{dd}$ and the deterioration in ON current of a TFT partially cut from the ring oscillator shown in FIG. 3 is calculated. Any TFT in the ring oscillator may be examined, and any number of TFT's may be examined regarding the deterioration in ON current. FIG. 8 shows a graph plotting the ratio of ON currents before and after stress application (ON-current after the stress application/initial ON-current before the stress application) in times corresponding to $\Delta V_{dd}$. The ratio of ON-currents before and after stress application can be obtained from the ON-current deterioration in the AC stress test and, for example, can be obtained from deterioration rates of ON-current shown in FIG. 4, for example.

As shown in FIG. 8, a straight approximate line can be obtained between the ratio of ON-currents before and after stress application and $\Delta V_{dd}$. Then, the ratio of ON-currents before and after stress application is about 0.7 when $\Delta V_{dd}$=0.2 V as shown in FIG. 8. It is possible to estimate the operational margin of the real semiconductor apparatus using $\Delta V_{dd}$, and the method of the estimation will be explained in fifth embodiment.

From this embodiment, the correlation between the DC (transient) stress test and the aging test can be obtained. Based on the obtained correlation, the reliability criteria close to the real operation of a semiconductor apparatus is applicable to the DC (transient) stress test method using a TEG. Through examinations and tests on a TEG in a short period of time, the deterioration of the semiconductor apparatus can be estimated.

Second Embodiment

Figure 9:
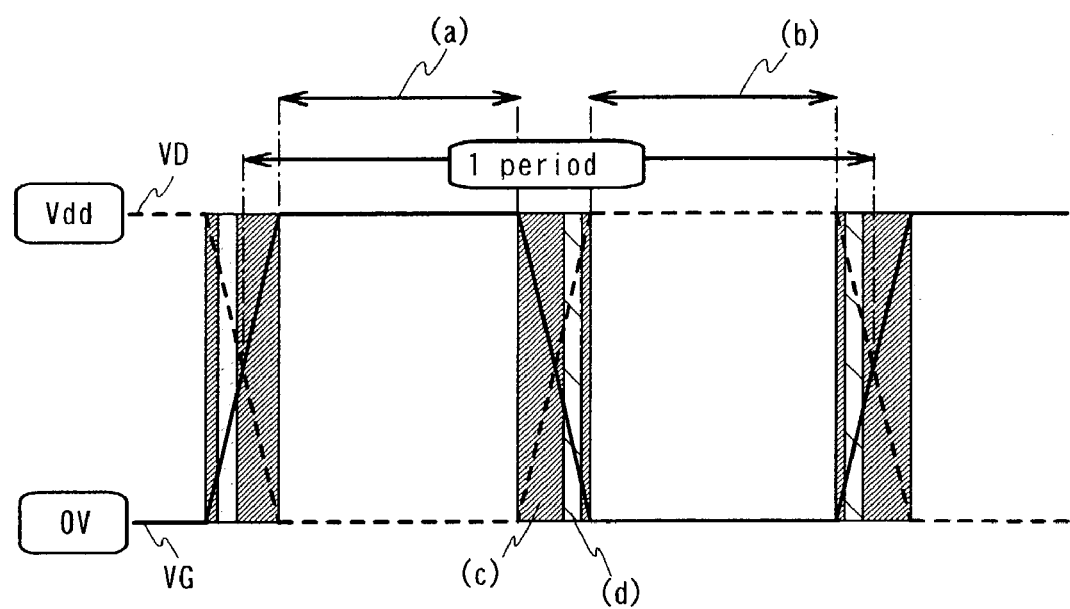
FIG. 9 is a diagram showing voltages to be applied in the examination method according to the invention.

Next, OFF-stress and ON-stress will be described. FIG. 9 shows waveforms of applied voltages in an AC stress test. FIG. 9 has an area (a) and area (b) where a voltage to be applied is constant and an area (c) where a voltage changes in a period. In the area (a) where the voltage is in the ON-stress state. The area (b) is the OFF-stress state. The area (c) has an area (d) of a transient state.

Figure 10A:
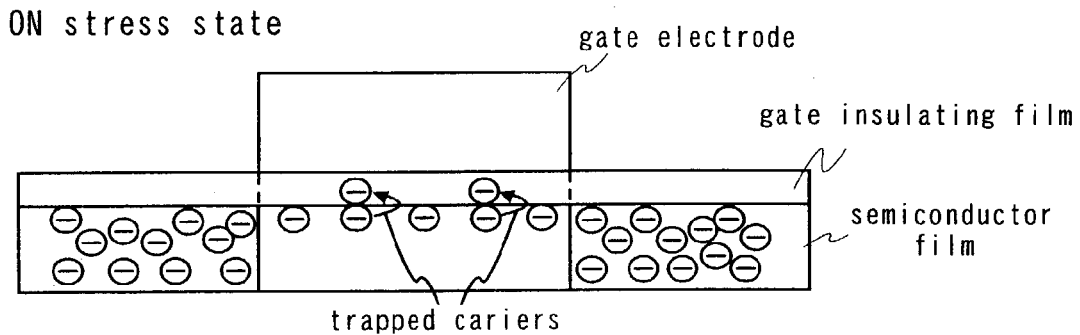
FIGS. 10A to 10C are diagrams each showing a deterioration state.
Figure 10B:
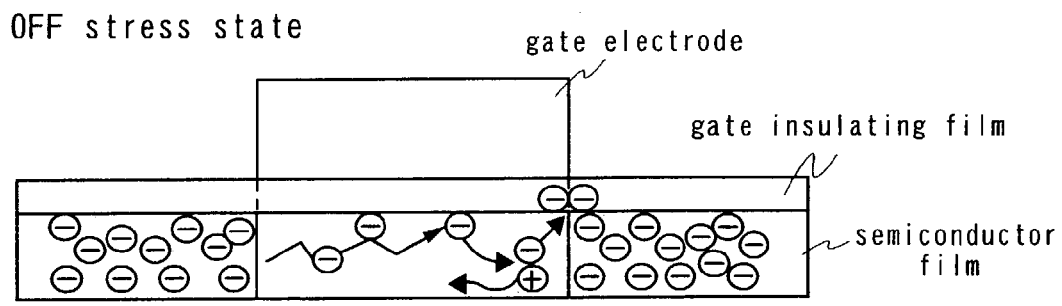
Figure 10C:
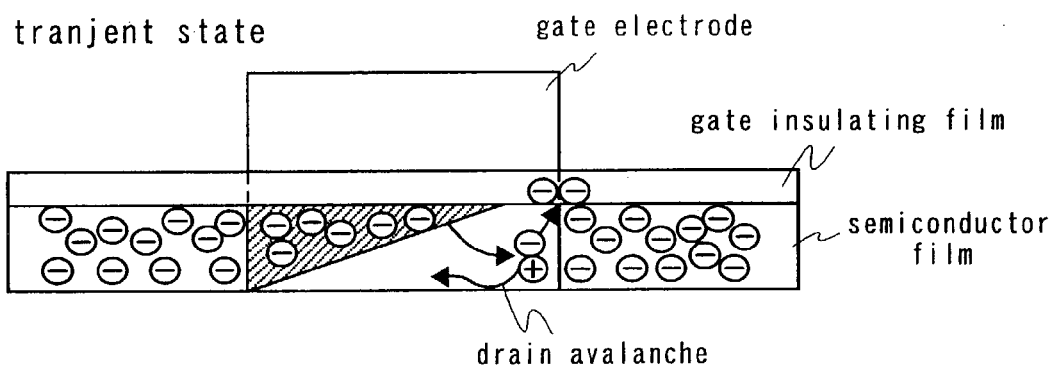

As shown in FIG. 10A, the deterioration in the ON-stress state may occur when carriers gathered under the gate electrode are trapped on an interface between a gate insulating film and a semiconductor film. As shown in FIG. 10B, the deterioration in the OFF-stress state may occur when carriers accelerated at the drain end having a higher electric field are implanted to the gate insulating film. FIG. 10C is a diagram of a channel portion in the transient state where the deterioration due to the drain avalanche hot carriers is the maximum. When DC stress is applied, the deterioration in On-current becomes the maximum around VG=Vth+1 V. Similarly, when AC stress is applied, it is considered that the deterioration in ON-current in the area (d) becomes higher. As described above, AC stress has multiple deterioration states. As a result, complicated deterioration occurs.

Therefore, in this embodiment, a method will be described for evaluating the estimation of the deterioration of a semiconductor apparatus highly precisely in consideration of unique deterioration of OFF-stress and ON-stress.

Figure 11:
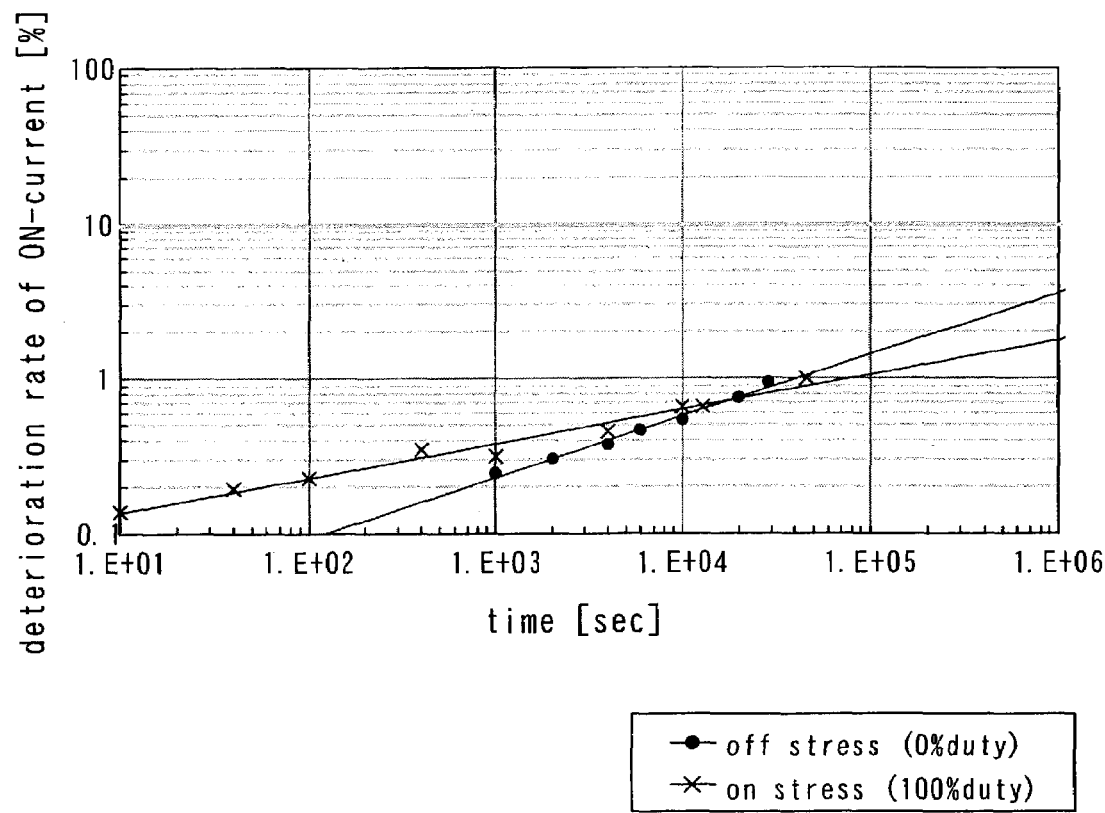
FIG. 11 is a diagram showing results of the examinations according to the invention.

FIG. 11 shows results of an OFF stress test and an ON stress test. The OFF stress state is a state with duty ratio 0%, and the ON stress state is a state with duty ratio 100% of the AC test assuming CMOS operation. From these results, it is understood that the deterioration rates of ON-current change in the OFF stress state and in the ON stress state. Similarly, results for duty rates (such as 0.5% and 50%) other than duty of 0% and 100% shown in FIG. 11 can be obtained. The test conditions are as follows.

Figure 12:
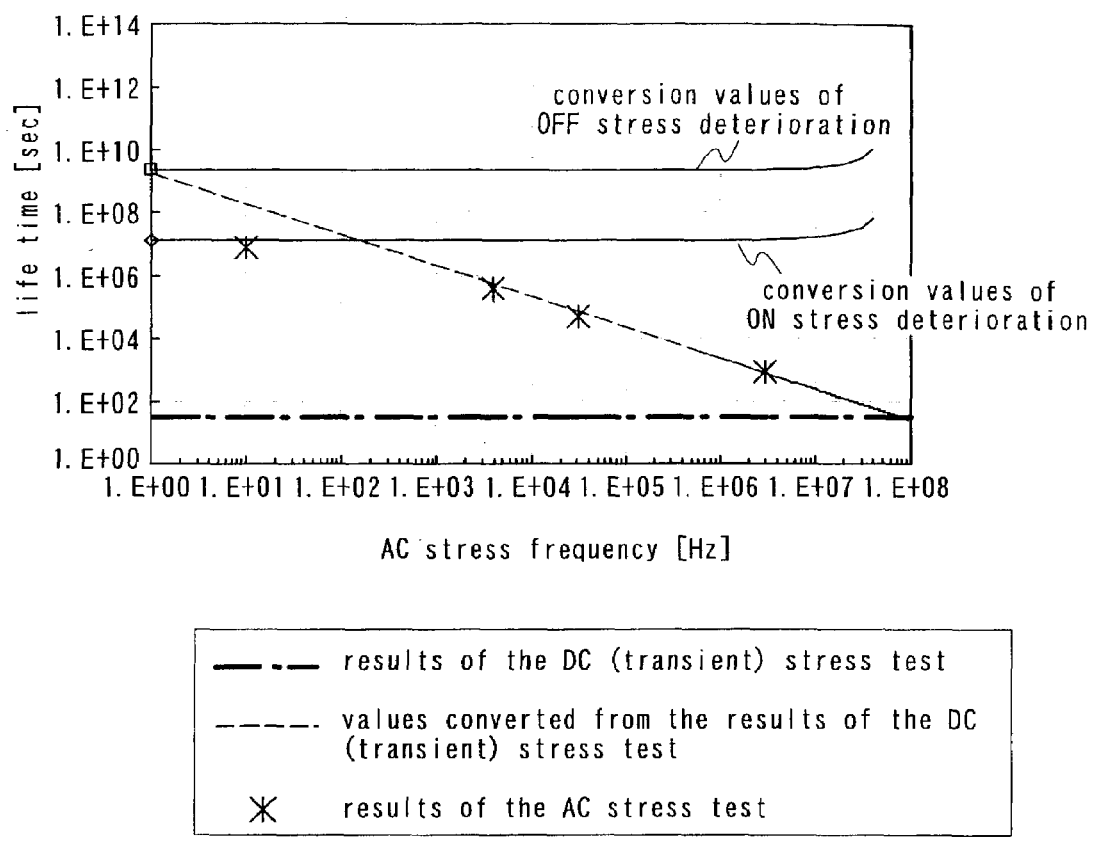
FIG. 12 is a diagram showing results of the examinations according to the invention.

Test Temperature: 40° C.
OFF stress state: 22V to the gate electrode, 0V to the drain region
ON stress state: 0V to the gate electrode, 22V to the drain region
Sample: Single N-channel type TFT with a channel size of L/W=10/8 μm FIG. 12 shows a graph plotting a life having the deterioration rate of 10% of ON-current in the OFF stress state and in the ON stress state in FIG. 11 and AC stress frequencies. The deterioration rate of ON current is not limited to 10% and may be set freely. FIG. 12 also shows results of the AC stress test, results of the DC (transient) test and values converted from the results of the DC (transient) test. The conversion of OFF stress deterioration and the conversion of ON stress deterioration shown in FIG. 12 are conversions in proportions in respective frequencies.

As shown in FIG. 12, the results of the AC stress Test are different from the values converted from DC (transient) stress. The difference occurs in the low frequency side where the conversion values of the DC (transient) stress test and the conversion values of OFF stress deterioration cross. In other words, the influences from the deterioration in the OFF-stress state occurs in the low frequency side, and the influences affect each other. Therefore, in order to evaluate the deterioration in the AC stress test at a low frequency, the influence of the deterioration in OFF stress state must be considered. Apparently, when the conversion values of DC (transient) stress Test crosses the deterioration in the ON stress state, the deterioration in ON stress state may need to consider.

As described above, like the first embodiment, the deterioration can be estimated in consideration of the deterioration in the ON stress state and the OFF stress state in the low frequency side with reference to FIG. 8 by calculating the correlation with $\Delta V_{dd}$. In other words, according to this embodiment, the measurement result can be obtained in consideration of the ON stress and the OFF stress deterioration in the low frequency side. Thus, the deterioration can be estimated more precisely.

By using the stress test according to this embodiment, an effective measure can be provided for analyzing the mechanism of the deterioration due to AC stress. In other words, how much the deterioration in the ON-stress and OFF stress states affects can be found. Thus, the deterioration of a semiconductor apparatus can be estimated highly precisely. According to the first embodiment and this embodiment, the deterioration can be estimated highly precisely through examinations and tests in a short period of time by using a TEG.

Third Embodiment

In this embodiment, an example of an examination method will be described in consideration of the deterioration unique to AC stress in the area (c) in FIG. 9 using an inverter chain.

Figure 13:
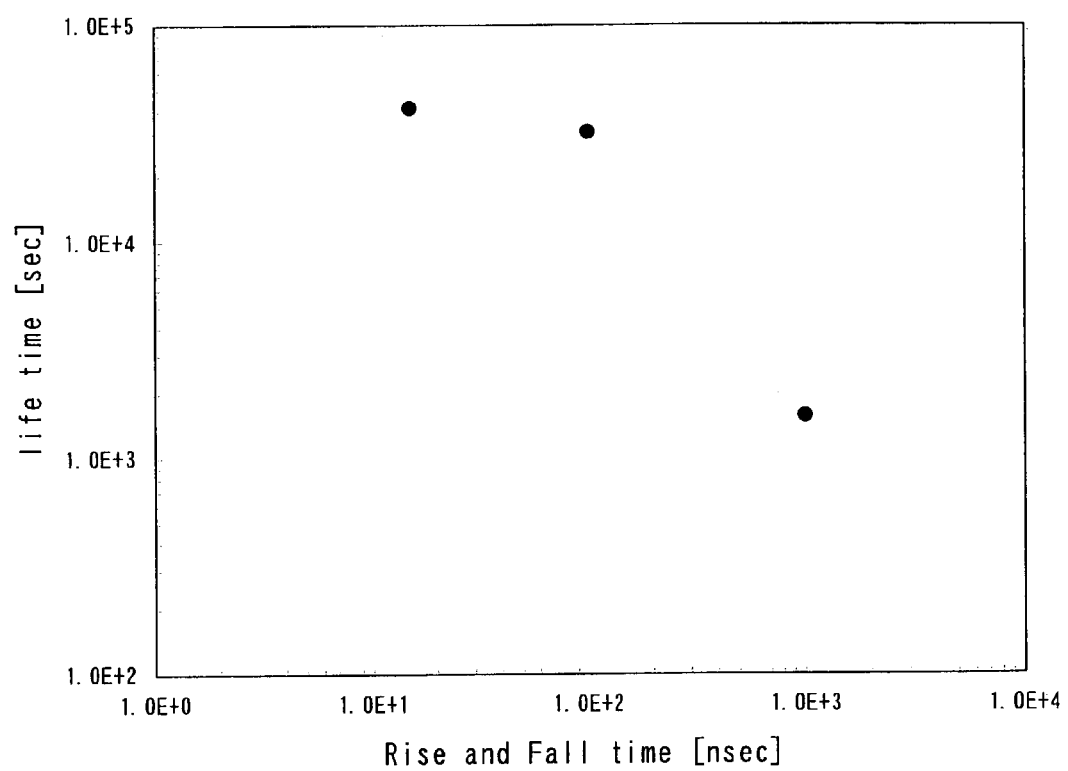
FIG. 13 is a diagram showing results of the examinations according to the invention.

FIG. 13 is a graph plotting a life that is a time where ON current of the semiconductor element in the inverter chain is deteriorated by 10% with respect to a time for periods (area (c)) for the rise and fall of applied voltage, which is AC stress. The test conditions are as follows.

Test Temperature: 40° C.
Stress Voltage: 0V and 22 V are applied by turns
Sample: 11 sections inverter chain (the channel size of the n-channel type TFT is L/W=10/10 µm and the p-channel type TFT is L/W=10/20 µm)

FIG. 13 shows that the life due to the hot carrier deterioration depends on the length of rise and fall periods of the applied voltage hereinafter referred to as rise and fall, which is AC stress, in the area (c) in FIG. 9. As the period of the area (c) increases, the life tends to decrease due to hot carrier deterioration.

Figure 14A:
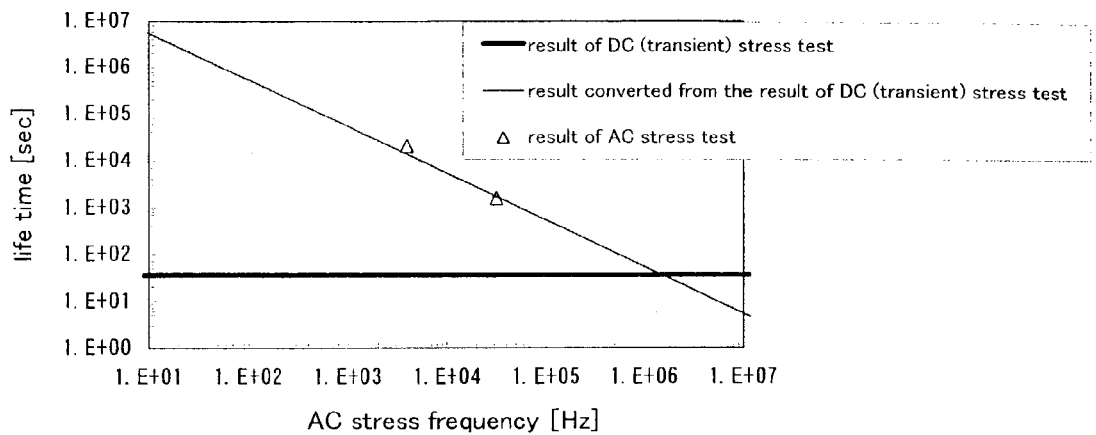
FIGS. 14A to 14C are diagrams each showing results of the examinations according to the invention.
Figure 14B:
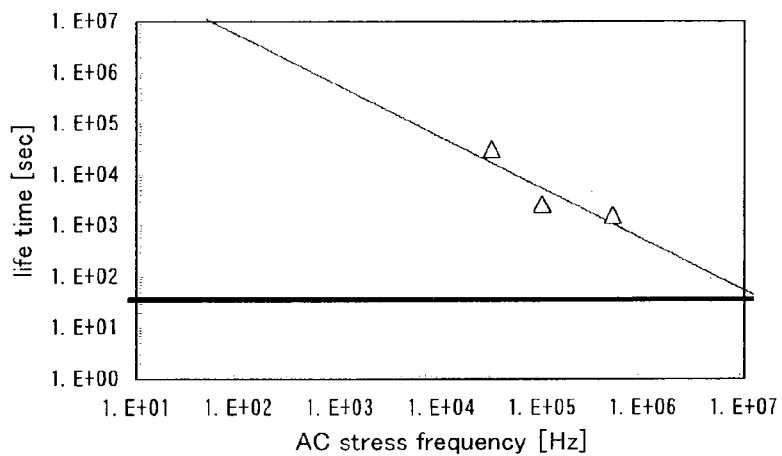
Figure 14C:
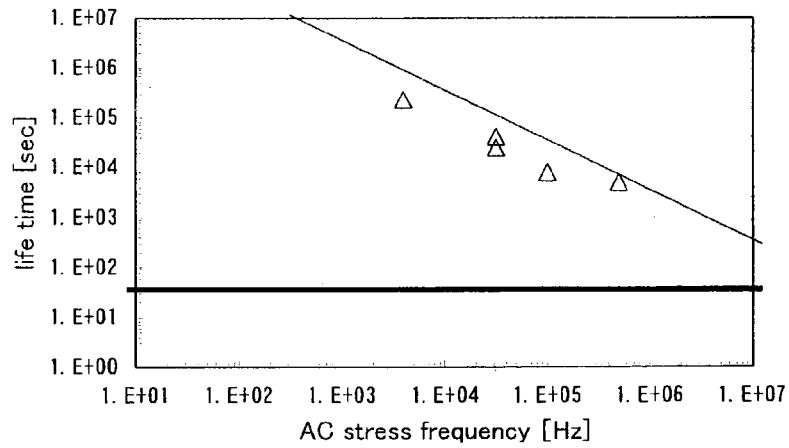

Therefore, in this embodiment, an AC stress test assuming the CMOS operation is performed in consideration of the dependency of the length of the rise and fall periods of an applied voltage, which is an AC stress. FIGS. 14A to 14C show graphs each plotting a time when the deterioration rate of ON current for the AC stress frequency is 10% as a life by using triangle symbols. In this case, the Rise and Fall time is 1 µsec., 100 nsec., and 15 nsec. The test conditions are as follows.

Test Temperature: 40° C.
Stress Voltage: 22 V
Stress Frequencies: 3.9 kHz, 31 kHz, 100 kHz and 500 kHz
Sample: 11 sections inverter chain (channel size of the n-channel type TFT L/W=10/10 µm and the p-channel type TFT L/W=10/20 µm)

Also, FIGS. 14A to 14C show results of a DC (transient) stress test and conversion values from the transient test results. The test conditions are as follows.

Test Temperature: 40° C.
Stress Voltage: Vth+1V to the gate electrode, 22V to the drain region
Sample: Single N-channel type TFT with a channel size of L/W=10/8 µm Based on the result, as the rise and fall period decreases as shown in FIG. 14C, the actually measured values are more different from the life converted from the result of the DC (transient) stress test. The actually measured life is shorter than the life converted from the result of the DC (transient) stress test. Therefore, as the rise and fall period decreases, that is, as the area (c) in FIG. 9 decreases and as the voltage rise and fall becomes steeper, the deterioration in the rise and fall period, unique to AC stress, must be more considered.

As described above, the deterioration should be considered by calculating the correlation with the $\Delta V_{dd}$ with reference to FIG. 8 like the first embodiment in consideration of the deterioration in the rise and fall period unique to AC stress as the voltage rise and fall become steeper. As a result, the deterioration can be estimated more accurately.

According to this embodiment, an effective measure can be provided for analyzing the mechanism of the deterioration due to AC stress. In other words, how much the rise and fall period unique to AC stress affect on the deterioration can be found. Thus, the deterioration of a semiconductor apparatus can be estimated highly precisely. According to the first embodiment and this embodiment, the deterioration can be estimated highly precisely through examinations and tests in a short period of time by using a TEG.

This embodiment can be used to estimate the deterioration of a semiconductor apparatus more highly accurately in combination with the second embodiment.

Fourth Embodiment

In this embodiment, a method for evaluation by using the power source current dependency of deterioration will be described.

Figure 15A:
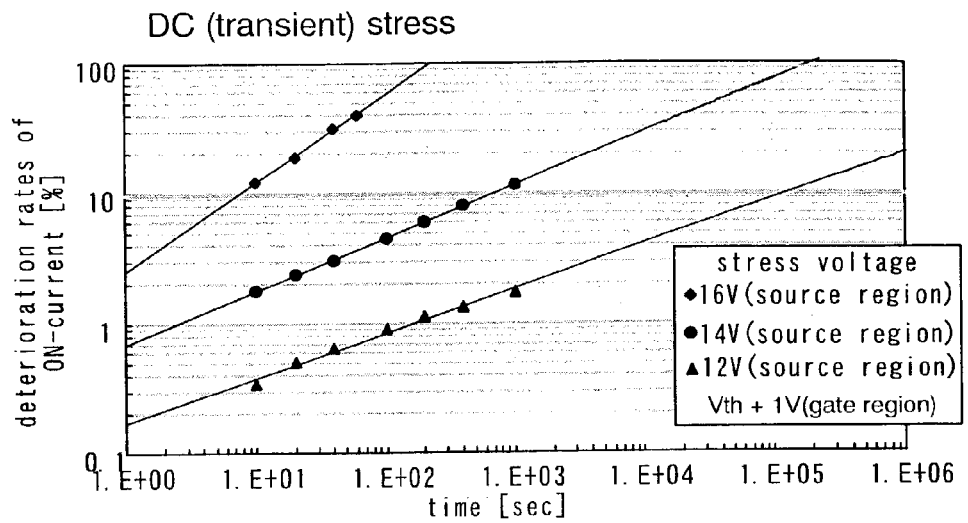
FIGS. 15A to 15C are diagrams each showing results of the examinations according to the invention.
Figure 15B:
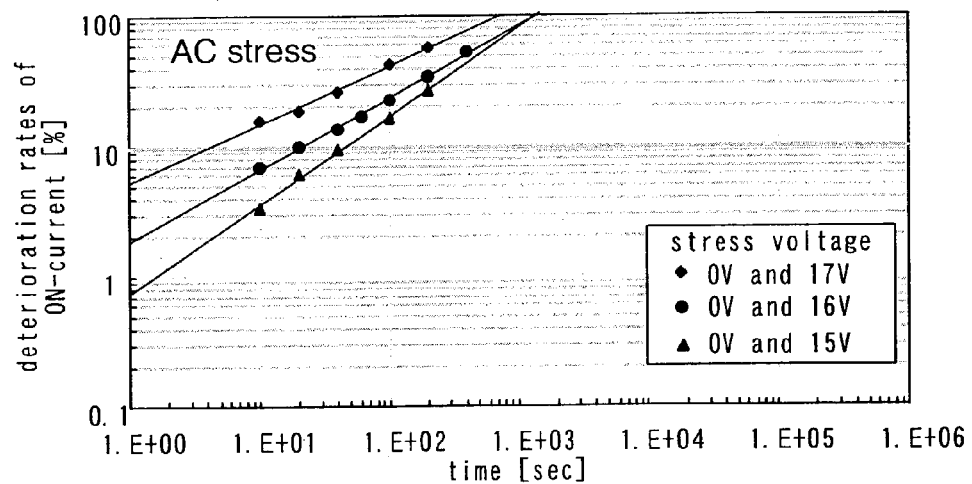
Figure 15C:
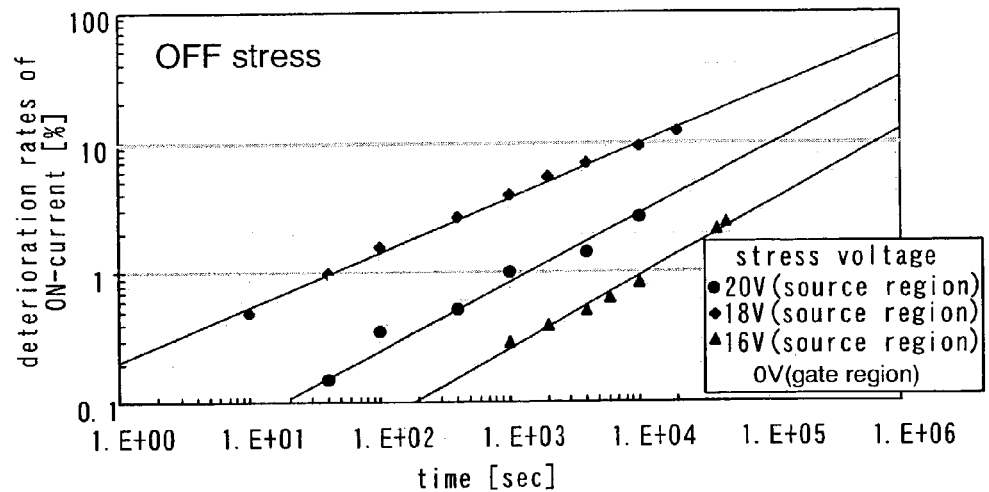

FIG. 15A is a graph showing deterioration rates of ON-current and times in the DC (transient) stress test. FIG. 15B is a graph showing deterioration rates of ON-current and times in the AC stress test assuming the CMOS operation. FIG. 15C is a graph showing deterioration rates of ON-current and times in the OFF stress test according to the second embodiment. The test conditions are as follows.

Test Temperature: 40° C.
Stress Condition:
(A) Vth+1 V to the gate electrode, 16 V or 14 V or 12 V to the drain region
(B) 0 V and 17 V or 16 V or 15 V are applied to the drain region and the gate electrode by turns; frequency 3 MHz
(C) 0 V to the gate electrode, 20 V or 18 V or 16 V to the drain region
Sample: Single N-channel type TFT with a channel size of L/W=10/8 µm Referring to FIG. 15, the deterioration speed depends on the value of applied voltage in each of the stress tests. Therefore, in this embodiment, an example will be described that a DC (transient) stress test, an AC stress test and an OFF stress test are performed in consideration of an applied voltage.

Figure 16A:
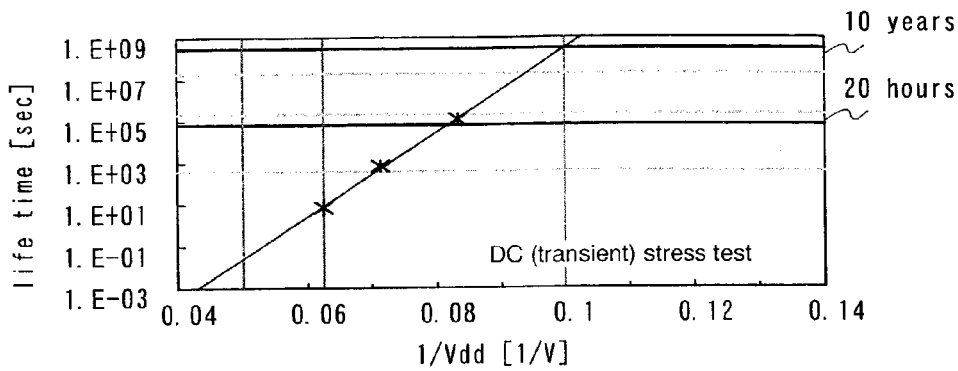
FIGS. 16A to 16D are diagrams each showing results of the examinations according to the invention.
Figure 16B:
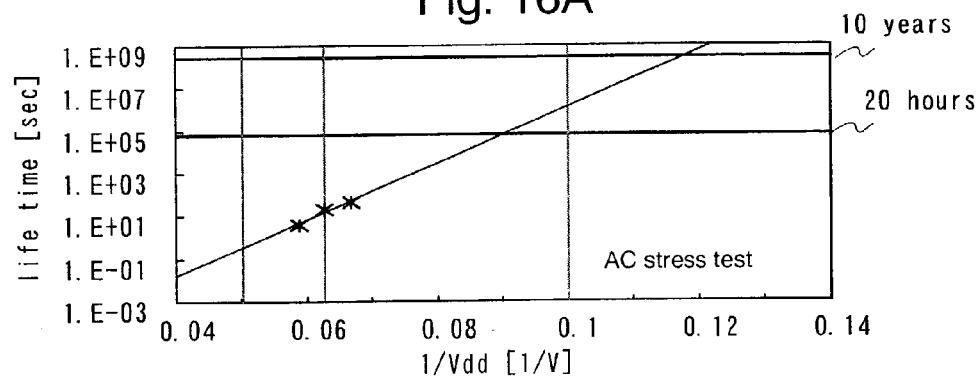
Figure 16C:
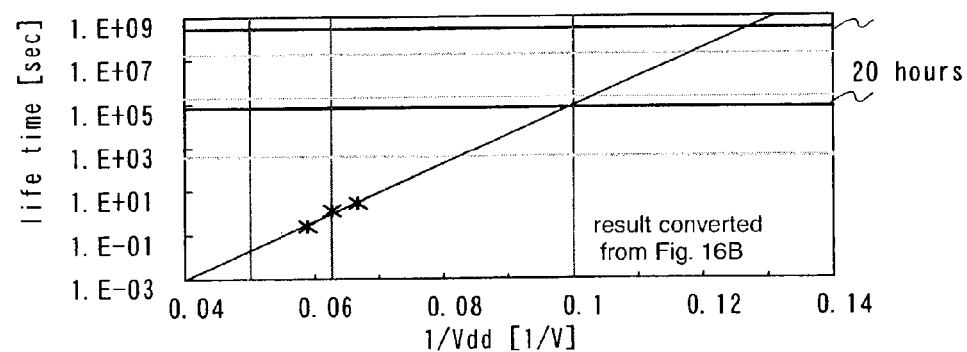
Figure 16D:
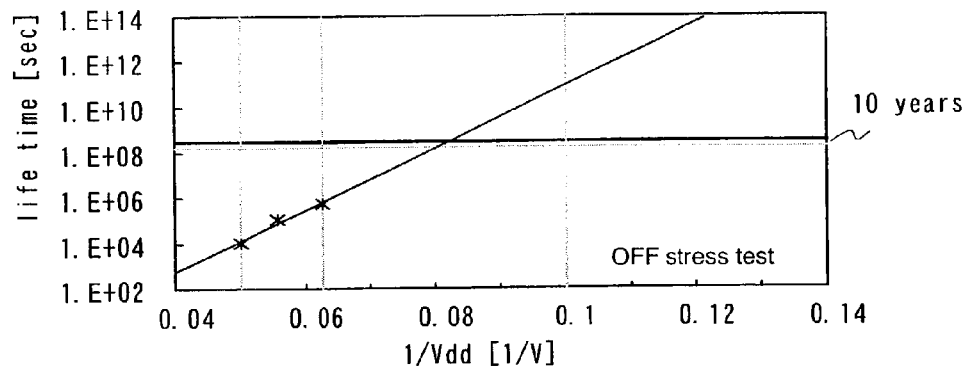

FIGS. 16A to 16D are graphs plotting reciprocals of drain voltages ($V_{dd}$) having ON-current deterioration based on FIGS. 15A to 15C and times in which ON-current decreases by 10% with respect to the reciprocals as a life. In this case, the deterioration rate of ON current can be set freely. FIG. 16A is a result of the DC (transient) stress test. FIG. 16B shows results of the AC stress test. FIG. 16C shows the result converted from the result of AC stress test shown in FIG. 16B in consideration of the deterioration in the rise and fall period according to the third embodiment. FIG. 16D shows the result of the OFF stress test.

Considering the result by the DC (transient) stress test shown by FIG. 16A and the result by the AC stress test shown by FIG. 16B are the same, it is possible to estimate the acceleration coefficient between DC (transient) stress test and AC stress test.

Furthermore, as shown in FIGS. 16A to 16D, by performing an acceleration test using voltages, the estimated proof voltage guaranteed for 10 years or 20 years in each of the stress tests can be calculated without taking an actual time.

The correlation with $\Delta V_{dd}$ is calculated in consideration of the power source voltage dependency of deterioration with reference to FIG. 8 according to the first embodiment. Thus, the deterioration in stress tests can be estimated.

As described above, by considering the power source voltage dependency of deterioration, it becomes possible to estimate the deterioration of a semiconductor apparatus after long time operation. Therefore, according to this embodiment, the deterioration in a semiconductor apparatus can be estimated highly precisely in a short period of time.

Fifth Embodiment

In this embodiment, a method for evaluating dynamic characteristic by using a shift register will be described.

Figure 19B:
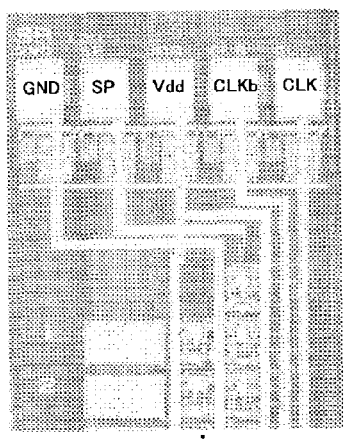
FIGS. 19A and 19B are diagrams each showing a semiconductor circuit according to the invention.
Figure 19B:
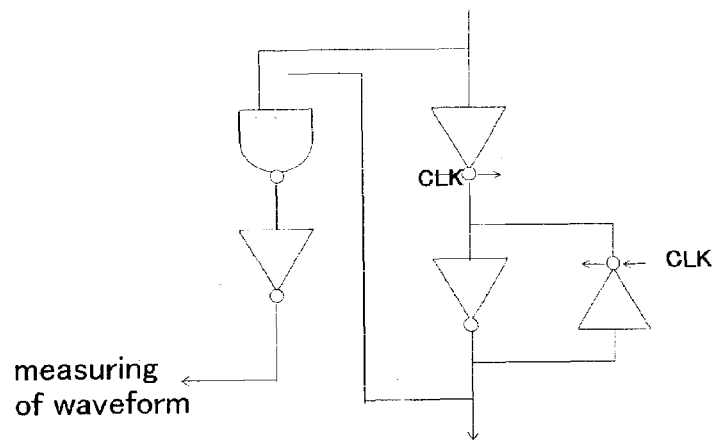
Figure 19A:
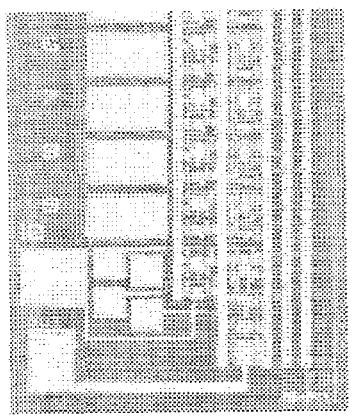

A dynamic characteristic deterioration test is performed by using a sample shift register shown in FIGS. 19A and 19B. FIG. 19A shows a photograph of the shift register. FIG. 19B shows an equivalent circuit diagram. In FIG. 19A, GND, SP, $V_{dd}$, CLK and CLKb indicate a ground region, a start pulse input region, a power source voltage supply region, clock signal input region and an inverse clock signal input region, respectively. The test conditions are as follows.

Figure 20A:
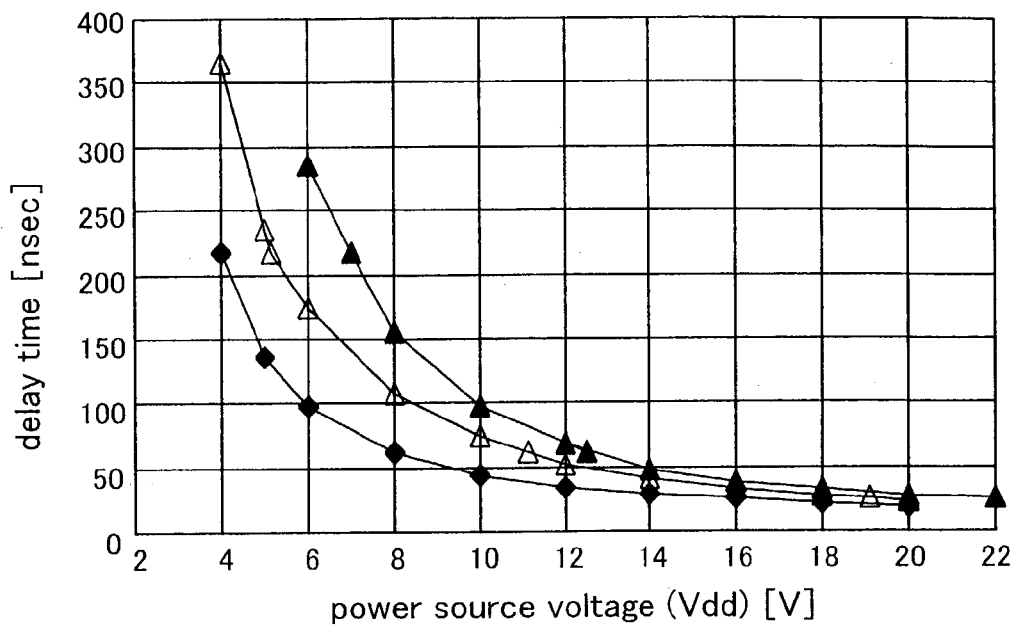
FIGS. 20A and 20B are diagrams each showing results of the examinations according to the invention.
Figure 20B:
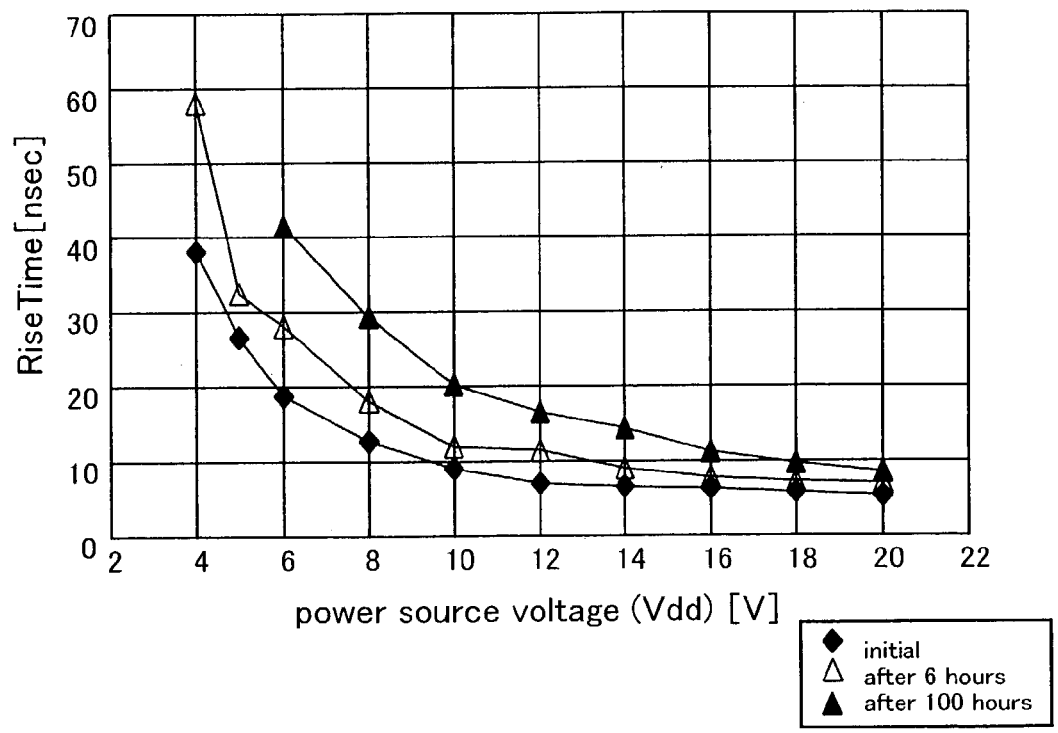

Test temperature: 40° C.
Stress Voltage: $V_{dd}$=20 V, pulse voltage of SP etc.=20 V
Stress Applying Time: zero (initial) to 100 hours
Sample: 10 sections shift register, the channel size of a TFT to be evaluated: L/W=10/20 μm FIGS. 20A and 20B show results of the measurement of power source voltage dependent characteristics with respect to delay times and the rise time (the rise period of the rise and fall period) in third, fifth, seventh and tenth section shift register before and after the stress application. In order to measure the power source voltage dependency characteristics, pulse widths, amplitudes or fall times may be alternatively used as the other parameter. The number of sections of shift register to be measured may be set freely. The measuring times are one, six and 100 hours here but may be set freely by the practitioner.

FIG. 20A shows a relationship between delay times and power source voltages in the third shift register. FIG. 20B shows a relationship between the rise times and power source voltages in the third shift register.

Referring to FIGS. 20A and 20B, as the measured power source voltage decreases, the values of the delay time and rise time increase. The tendency does not change even after the stress application. The same result can be obtained in the other shift registers.

Figure 21A:
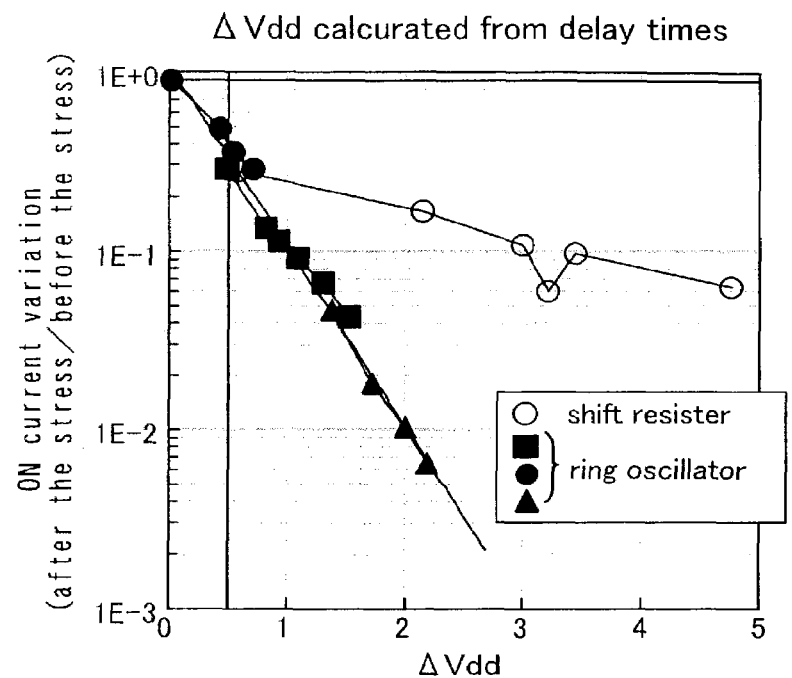
FIGS. 21A and 21B are diagrams each showing results of the examinations according to the invention.
Figure 21B:
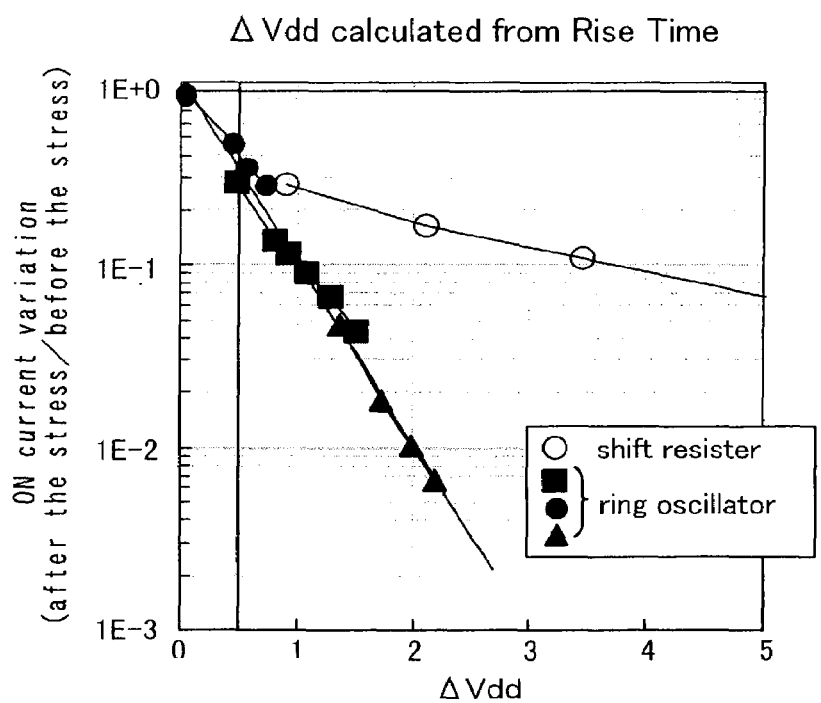

FIGS. 21A and 21B show the relationships between the amount of change ($\Delta V_{dd}$), in power source voltage and the deterioration in ON-current (On-current after the stress application/ON-current before the stress application), which are calculated from FIGS. 20A and 20B, respectively. FIGS. 21A and 21B also show $\Delta V_{dd}$ by the ring oscillator shown in FIG. 8.

FIGS. 21A and 21B describe that $\Delta V_{dd}$ calculated from the delay time and $\Delta V_{dd}$ calculated from the rise time in the shift register have larger operational margin (that is, $\Delta V_{dd}$) for the ON-current deterioration than $\Delta V_{dd}$ by a ring oscillator. Since the shift register is closer to the circuit within a semiconductor apparatus than a ring oscillator, it is considered that the correlation between $\Delta V_{dd}$ and the deterioration in ON-current, which are obtained from the shift register evaluation, indicates the deterioration characteristic (dynamic characteristic) of a semiconductor apparatus more precisely. Therefore, by evaluating $\Delta V_{dd}$ by using a shift register, closer deterioration characteristic to a semiconductor apparatus can be obtained.

Furthermore, by calculating the correlation between the evaluation using a ring oscillator and the evaluation using a shift register, a semiconductor apparatus can be evaluated more accurately than the easy evaluation by using the ring oscillator.

The invention can be applied to circuits other than shift registers. In other words, if a circuit can use the y-axis shown in FIG. 6 as a dynamic characteristic parameter and can obtain $\Delta V_{dd}$ by calculating the measured $V_{dd}$ corresponding to the parameter, the invention can be applied to the circuit.

Sixth Embodiment

This embodiment describes an example where stress tests are performed according to any one of the first to fifth embodiments or the combination, and the results are reflected on steps for producing a semiconductor apparatus. In the tests, the construction of a semiconductor element, such as a TFT, included in a TEG, the crystallization and activation conditions and a dose amount in impurity areas are varied.

Figure 17:
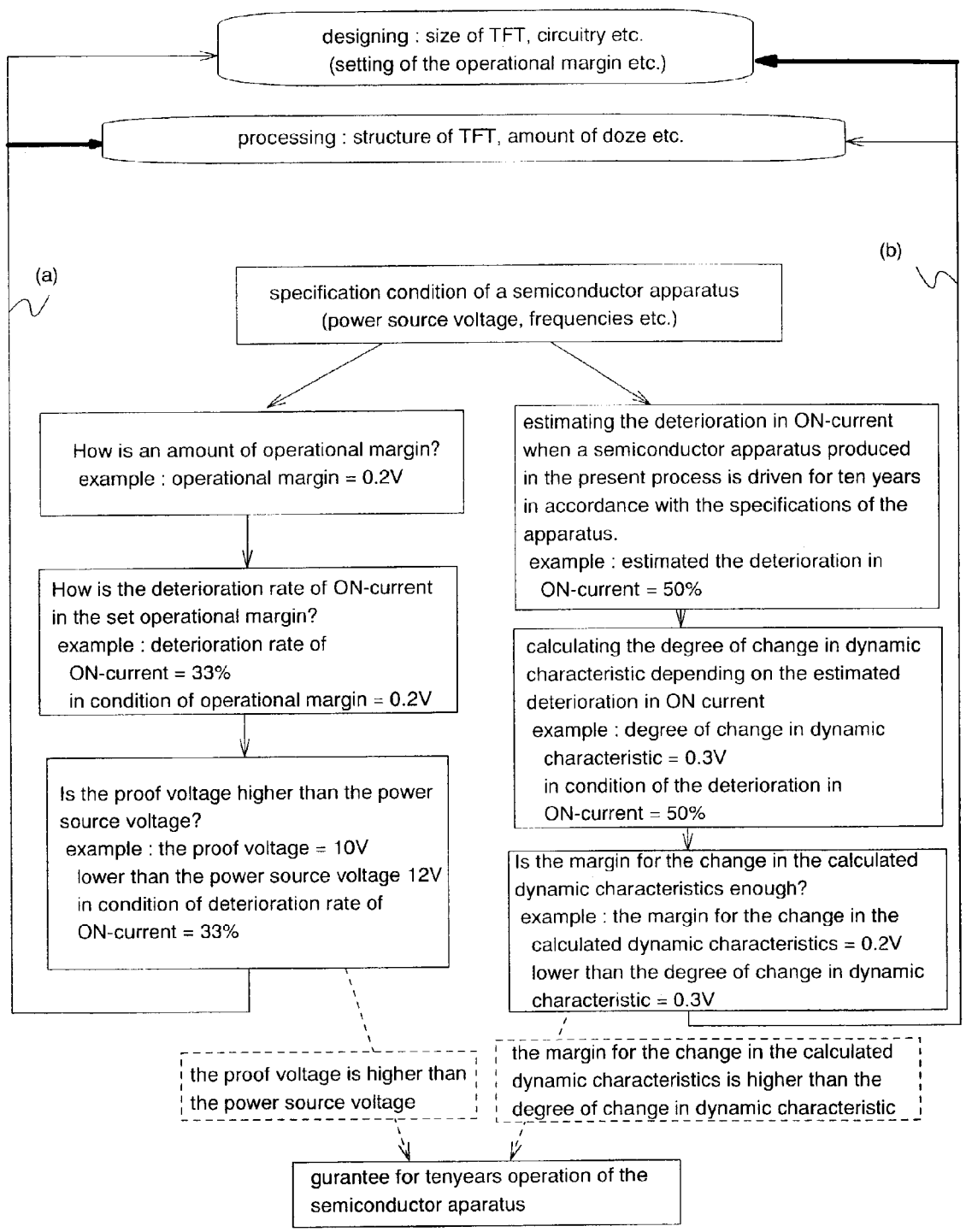
FIG. 17 is a diagram showing an examination method of the invention and conditions for producing a semiconductor apparatus.

As shown in FIG. 17, two routes for reflecting the result or the production steps roughly exist. In a first route (a), an amount of operational margin to be designed is set based on specification requirements (such as a power source voltage and a frequency) of a semiconductor apparatus.

In the route (a), the deterioration rate of ON-current in the set operational margin is calculated. The proof voltage in the calculated deterioration rate of ON-current must be higher than the power source voltage, which is a specification of the semiconductor apparatus. The conditions to be corrected for obtaining the proof voltage is mainly reflected on processes, and the processes are corrected and are changed. The conditions may be reflected on the design. Apparently, the conditions, which are not necessary to correct, may be used in the processes and the design as they are.

In the example of the route (a), the power source voltage is 12 V, which is a specification of the semiconductor apparatus. Based on the value, the operational margin (dynamic characteristic deterioration) of the semiconductor apparatus is designed to obtain 0.2 V. The operational margin of the semiconductor apparatus corresponds to $\Delta_{dd}$ as described above. The deterioration in ON-current can be accepted up to 33% with reference to FIG. 8. By performing a DC stress test and an AC stress test on a TEG manufactured by way of trial in a present process, for example, the proof voltage for deteriorating the ON-current by 33% can be 10 V. Therefore, it is understood that the proof voltage is not larger than the power source voltage 12 V, which is the specification of the apparatus. In this case, more reliable processes must be used. Therefore, the fact is reflected on the process so as to improve the reliability.

The results of the tests under the process conditions are recorded or are stored in a database. Thus, the process condition the most suitable for a semiconductor apparatus can be selected from the multiple process conditions in accordance with the purpose such as a pixel portion and a driving circuit portion of a panel. After that, for example, the application amount of impurity to change to an impurity area, and crystallization or activation condition can be input to the doping device, the heating furnace and the laser irradiating device, respectively. Furthermore, a gate electrode structure and construction of a low-density impurity region proper to a semiconductor apparatus can be obtained for a short period of time.

In other words, by storing results obtained from the examination method of the invention in a database, a method for managing a semiconductor device production and a semiconductor device manufacturing system can be provided.

Figure 18:
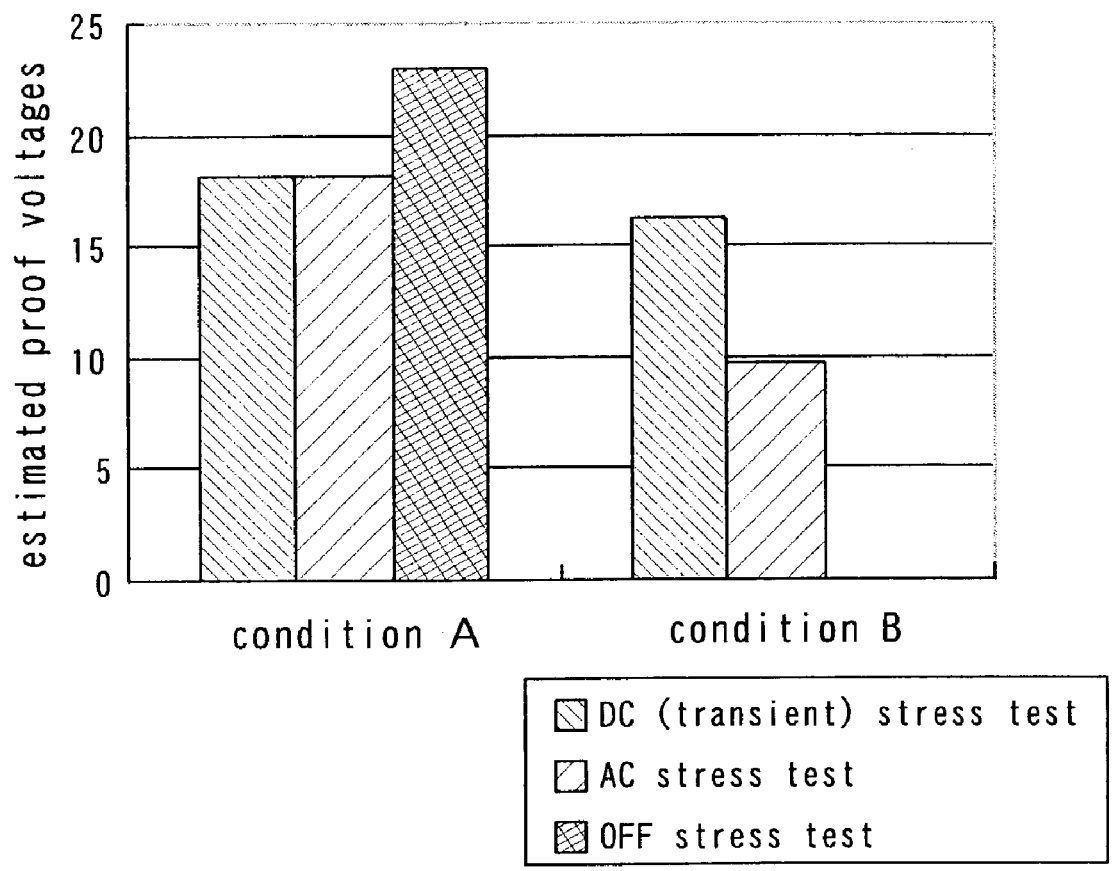
FIG. 18 is a diagram showing results of the examinations according to the invention.

FIG. 18 shows results from the calculation of the estimated proof voltages for ten years, which are estimated from DC (transient) stress tests, AC stress tests and stress tests in consideration of OFF stress based on the route (a). The conditions A and B are conditions with thermal activation (condition A) and without thermal activation (condition B), respectively, for tests on TFT's having the same construction. However, as a result of the stress test in consideration of OFF stress under the condition B, the deterioration was hardly recognized. Therefore, the result of the stress test in consideration of OFF stress is not shown in the table. This means that the deterioration due to OFF stress does not have to be considered under the condition B.

Referring to FIG. 18, when the power source voltage is 12 V, which is a specification of an apparatus, the estimated proof voltage in the AC stress test under the condition B does not reach 12 V. In other words, in order to obtain the estimated proof voltage of 12 V or more, the condition A is better. Therefore, the step for performing the thermal activation, which is the condition A, can be adopted to the process for a semiconductor apparatus.

The other route (b) is used for estimating a degree of the deterioration in ON-current when a semiconductor apparatus produced in the present process is driven for ten years in accordance with the specifications of the apparatus. In this case, stress tests are performed on the TEG. The deterioration of the semiconductor apparatus after ten years can be evaluated and be estimated by performing an acceleration test in a short period of time. The degree of change in dynamic characteristic is calculated depending on the estimated deterioration in ON current. Next, the presence of the margin for the change in the calculated dynamic characteristics, that is, the change in dynamic characteristics estimated in the present process is reflected on the design. Apparently, the presence of the margin may be reflected on the process.

An example of the route (b) will be described. When a semiconductor apparatus manufactured in the present process is driven at the power source voltage and frequency, which are the specifications, for ten years, the deterioration in ON-current is estimated as about 50% by performing the acceleration tests on the TEG. The acceleration tests may be a DC stress test and an AC stress test. Based on the tests, the deterioration in ON current is estimated as about 50%. Referring to FIG. 8, the dynamic characteristic change is 0.3 V at the deterioration of 50% in ON-current. After that, the result is reflected to the design so as to obtain an operational margin, which can accept the dynamic characteristic change 0.3 V.

According to this embodiment, a highly reliable semiconductor apparatus can be obtained by incorporating the result obtained by stress tests, as design guidelines for conditions for manufacturing the semiconductor apparatus. Alternatively, the condition for obtaining a high power source voltage of a semiconductor apparatus may be reflected to the process and design. By incorporating the result obtained from the stress tests of the invention as the design guidelines for a semiconductor apparatus, a highly reliable semiconductor apparatus having better characteristics can be provided.

What is claimed is:

1. A method of examining a semiconductor apparatus, comprising the steps of:
   measuring a first current flowing in a first semiconductor element when a constant voltage is applied to the first semiconductor element for a first period of time;
   calculating a deterioration rate of the first current from a first current value at a beginning of the first period of time and a first current value at an end of the first period of time;
   measuring a second current flowing in a second semiconductor element when a pulse-shaped voltage is applied to the second semiconductor element for a second period of time;
   calculating a deterioration rate of the second current from a second current value at a beginning of the second period of time and a second current value at an end of the second period of time; and
   calculating an acceleration coefficient from a time when the deterioration rate of the first current becomes a predetermined value and a time when the deterioration rate of the second current becomes the predetermined value.

2. A method for designing a semiconductor apparatus based on the deterioration of the semiconductor apparatus, the deterioration being estimated by using the examination method according to claim 1.

3. A method of examining a semiconductor apparatus according to claim 1, wherein the first semiconductor element, the second semiconductor element and the plurality of semiconductor elements are thin film transistors.

4. A method of examining a semiconductor apparatus according to claim 1, wherein a state of applying the ON-stress to the first semiconductor element is that a potential of a gate electrode of the first semiconductor element is a predetermined value and a potential of a drain electrode of the first semiconductor element is 0 V.

5. A method of examining a semiconductor apparatus according to claim 1, wherein a state of applying the OFF-stress to the second semiconductor element is that a potential of a gate electrode of the second semiconductor element is 0 V and a potential of a drain electrode of the second semiconductor element is a predetermined value.

6. A method of examining a semiconductor apparatus according to claim 1, wherein a state of applying the transient stress to the third semiconductor element is that a potential of a gate electrode of the third semiconductor element is (Vth +1) V and a potential of a drain electrode of the second semiconductor element is 0 V.

7. A method of examining a semiconductor apparatus, comprising the steps of:
measuring a first current flowing in a first semiconductor element when an ON-stress is applied to the first semiconductor element for a first period of time;
calculating a deterioration rate of the first current from a first current value at a beginning of the first period of time and a first current value at an end of the first period of time;
measuring a second current flowing in a second semiconductor element when an OFF-stress is applied to the second semiconductor element for a second period of time;
calculating a deterioration rate of the second current from a second current value at a beginning of the second period of time and a second current value at an end of the second period of time;
measuring a third current flowing in a third semiconductor element when a transient stress is applied to the third semiconductor element for a third period of time;
calculating a deterioration rate of the third current from a third current value at a beginning of the third period of time and a third current value at an end of the third period of time;
measuring a fourth current flowing in a fourth semiconductor element when a pulse-shaped voltage is applied to the fourth semiconductor element for a fourth period of time; and
calculating a deterioration rate of the fourth current from a fourth current value at a beginning of the fourth period of time and a fourth current value at an end of the fourth period of time.

8. A method for designing a semiconductor apparatus based on the deterioration of the semiconductor apparatus, the deterioration being estimated by using the examination method according to claim 7.

9. A method of examining a semiconductor apparatus according to claim 7, wherein the first semiconductor element, the second semiconductor element, the third semiconductor element and the plurality of semiconductor elements are thin film transistors.

10. A method of examining a semiconductor apparatus, comprising the steps of:
setting a first power source voltage applied to a semiconductor circuit to operate the semiconductor circuit in a predetermined frequency;
applying a first power voltage to the semiconductor circuit for a predetermined period of time after measuring the first power source voltage;
measuring a second power source voltage applied to the semiconductor circuit to operate the semiconductor circuit in the predetermined frequency after applying the first power voltage for the predetermined period of time;
measuring a first current flowing in the first semiconductor element when a constant voltage is applied to the first semiconductor element for a first period of time, wherein the first semiconductor element constitutes the semiconductor circuit before applying the first power source voltage for the predetermined period of time;
calculating a deterioration rate of the first current from a first current value at a beginning of the first period of time and a first current value at an end of the first period of time;
measuring a second current flowing in the second semiconductor element when a pulse-shaped voltage is applied to the second semiconductor element for a second period of time, wherein the second semiconductor element constitutes the semiconductor circuit before applying the first power source voltage for the predetermined period of time;
calculating a deterioration rate of the second current from a second current value at a beginning of the second period of time and a second current value at an end of the second period of time;
measuring a third current flowing in the third semiconductor element when a constant voltage is applied to the third semiconductor element for a third period of time, wherein the third semiconductor element constitutes the semiconductor circuit after applying the first power source voltage for the predetermined period of time;
calculating a deterioration rate of the third current from a third current value at a beginning of the third period of time and a third current value at an end of the third period of time;
measuring a fourth current flowing in the fourth semiconductor element when a pulse-shaped voltage is applied to the fourth semiconductor element for a fourth period of time, wherein the fourth semiconductor element constitutes the semiconductor circuit after applying the first power source voltage for the predetermined period of time; and
calculating a deterioration rate of the fourth current from a fourth current value at a beginning of the fourth period of time and a fourth current value at an end of the fourth period of time.

11. A method for designing a semiconductor apparatus based on the deterioration of the semiconductor apparatus, the deterioration being estimated by using the examination method according to claim 10.

12. A method of examining a semiconductor apparatus according to claim 10, wherein the semiconductor circuit is one of a ring oscillator, a shift register and an inverter circuit.

13. A method of examining a semiconductor apparatus according to claim 10, wherein the first, second, third and fourth semiconductor elements are thin film transistors.

* * * * *